US011152909B2

(12) United States Patent
Bradley et al.

(10) Patent No.: US 11,152,909 B2
(45) Date of Patent: Oct. 19, 2021

(54) BULK ACOUSTIC WAVE RESONATORS HAVING LOW ATOMIC WEIGHT METAL ELECTRODES

(71) Applicant: Avago Technologies International Sales Pte. Limited, Singapore (SG)

(72) Inventors: Paul Bradley, Los Altos, CA (US); John D. Larson, III, Palo Alto, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 681 days.

(21) Appl. No.: 15/957,235

(22) Filed: Apr. 19, 2018

(65) Prior Publication Data
US 2019/0326873 A1 Oct. 24, 2019

(51) Int. Cl.
*H03H 9/02* (2006.01)
*H03H 9/56* (2006.01)
*H03H 9/17* (2006.01)
*H03H 9/13* (2006.01)

(52) U.S. Cl.
CPC ...... *H03H 9/0211* (2013.01); *H03H 9/02015* (2013.01); *H03H 9/131* (2013.01); *H03H 9/175* (2013.01); *H03H 9/56* (2013.01); *H03H 9/568* (2013.01)

(58) Field of Classification Search
CPC .. H03H 9/0211; H03H 9/02015; H03H 9/131; H03H 9/175
See application file for complete search history.

(56) References Cited

U.S. PATENT DOCUMENTS

| | | | |
|---|---|---|---|
| 5,587,620 A | 12/1996 | Ruby et al. |
| 5,873,153 A | 2/1999 | Ruby et al. |
| 5,910,756 A | 6/1999 | Ella |
| 6,060,818 A | 5/2000 | Ruby et al. |
| 6,107,721 A | 8/2000 | Lakin |
| 6,262,637 B1 | 7/2001 | Bradley et al. |
| 6,507,983 B1 | 1/2003 | Ruby et al. |
| 6,828,713 B2 | 12/2004 | Bradley et al. |
| 7,280,007 B2 | 10/2007 | Feng et al. |
| 7,345,410 B2 | 3/2008 | Grannen et al. |
| 7,358,831 B2 | 4/2008 | Larson, III et al. |
| 7,369,013 B2 | 5/2008 | Fazzio et al. |
| 7,388,454 B2 | 6/2008 | Ruby et al. |
| 7,561,009 B2 | 7/2009 | Larson, III et al. |
| 7,629,865 B2 | 12/2009 | Ruby |

(Continued)

*Primary Examiner* — Derek J Rosenau
(74) *Attorney, Agent, or Firm* — Foley & Lardner LLP

(57) ABSTRACT

A BAW resonator comprises: a substrate comprising an acoustic reflector; a first electrode disposed over the acoustic reflector, and comprising a first electrode layer comprising a comparatively high acoustic impedance material, and a second electrode layer comprising a comparatively low acoustic impedance; a piezoelectric layer disposed over the second electrode layer; and a second electrode disposed over the piezoelectric layer, and comprising a third electrode layer comprising the low acoustic impedance, and a fourth electrode layer comprising the comparatively high acoustic impedance material and being disposed directly on the piezoelectric layer. A total thickness of an acoustic stack of the BAW resonator is approximately $\lambda/2$, where $\lambda$ is a wavelength corresponding to a thickness extensional resonance frequency of the BAW resonator.

17 Claims, 7 Drawing Sheets

(56) References Cited

U.S. PATENT DOCUMENTS

| | | | |
|---|---|---|---|
| 7,714,684 B2 | 5/2010 | Ruby et al. | |
| 7,791,434 B2 | 9/2010 | Fazzio et al. | |
| 8,188,810 B2 | 5/2012 | Fazzio et al. | |
| 8,230,562 B2 | 7/2012 | Fazzio et al. | |
| 8,248,185 B2 | 8/2012 | Choy et al. | |
| 8,390,397 B2 | 3/2013 | Jamneala et al. | |
| 8,436,516 B2 | 5/2013 | Ruby et al. | |
| 8,673,121 B2 | 3/2014 | Larson, III et al. | |
| 8,902,023 B2 | 12/2014 | Choy et al. | |
| 8,981,876 B2 | 3/2015 | Jamneala et al. | |
| 9,088,265 B2 | 7/2015 | Bradley et al. | |
| 9,136,819 B2 | 9/2015 | Grannen et al. | |
| 9,197,185 B2 | 11/2015 | Zou et al. | |
| 9,243,316 B2 | 1/2016 | Larson, III et al. | |
| 9,401,691 B2 | 7/2016 | Zou et al. | |
| 9,444,428 B2 | 9/2016 | Ruby et al. | |
| 9,450,167 B2 | 9/2016 | Zou et al. | |
| 9,455,681 B2 | 9/2016 | Feng et al. | |
| 9,479,139 B2 | 10/2016 | Ruby et al. | |
| 9,484,882 B2 | 11/2016 | Burak et al. | |
| 9,490,418 B2 | 11/2016 | Burak et al. | |
| 9,520,855 B2 | 12/2016 | Feng et al. | |
| 9,525,397 B2 | 12/2016 | Burak | |
| 9,548,438 B2 | 1/2017 | Burak et al. | |
| 9,564,553 B2 | 2/2017 | Katona et al. | |
| 9,571,063 B2 | 2/2017 | Burak et al. | |
| 9,571,064 B2 | 2/2017 | Burak et al. | |
| 9,577,603 B2 | 2/2017 | Burak et al. | |
| 9,590,165 B2 | 3/2017 | Zou et al. | |
| 9,602,073 B2 | 3/2017 | Grannen et al. | |
| 9,608,592 B2 | 3/2017 | Bi et al. | |
| 9,608,594 B2 | 3/2017 | Burak et al. | |
| 9,621,126 B2 | 4/2017 | Burak et al. | |
| 9,667,220 B2 | 5/2017 | Sridaran et al. | |
| 9,679,765 B2 | 6/2017 | Larson, III et al. | |
| 9,680,439 B2 | 6/2017 | Nikkel et al. | |
| 9,680,445 B2 | 6/2017 | Barfknecht et al. | |
| 9,691,963 B2 | 6/2017 | Burak | |
| 9,698,753 B2 | 7/2017 | Burak | |
| 9,698,754 B2 | 7/2017 | Burak | |
| 9,634,642 B2 | 8/2017 | Burak et al. | |
| 9,748,918 B2 | 8/2017 | Burak et al. | |
| 9,768,353 B2 | 9/2017 | Katona et al. | |
| 9,917,567 B2 | 3/2018 | Bradley et al. | |
| 2010/0117762 A1* | 5/2010 | Taniguchi | H03H 9/131 333/187 |
| 2012/0326807 A1 | 12/2012 | Choy et al. | |
| 2013/0015747 A1 | 1/2013 | Ruby et al. | |
| 2014/0132117 A1 | 5/2014 | Larson, III | |
| 2014/0174908 A1 | 6/2014 | Feng et al. | |
| 2014/0246305 A1 | 9/2014 | Larson, III | |
| 2015/0145610 A1 | 5/2015 | Ruby et al. | |
| 2015/0240349 A1 | 8/2015 | Grannen et al. | |
| 2015/0247232 A1 | 9/2015 | Nikkel et al. | |
| 2015/0280687 A1 | 10/2015 | Burak et al. | |
| 2015/0280688 A1 | 10/2015 | Ortiz et al. | |
| 2015/0311046 A1 | 10/2015 | Yeh et al. | |
| 2015/0326200 A1 | 11/2015 | Grannen et al. | |
| 2015/0349743 A1* | 12/2015 | Burak | H01L 41/107 310/313 R |
| 2015/0349745 A1 | 12/2015 | Small | |
| 2016/0079958 A1 | 3/2016 | Burak | |
| 2016/0126930 A1 | 5/2016 | Zou et al. | |
| 2016/0191015 A1 | 6/2016 | Ivira et al. | |
| 2016/0308509 A1 | 10/2016 | Burak et al. | |
| 2016/0352306 A1 | 12/2016 | Bradley et al. | |
| 2016/0352308 A1 | 12/2016 | Ivira et al. | |
| 2017/0047907 A1 | 2/2017 | Burak et al. | |
| 2017/0085247 A1 | 3/2017 | Ruby et al. | |
| 2017/0155373 A1 | 6/2017 | Ruby et al. | |
| 2017/0179923 A1* | 6/2017 | Shin | H03H 3/02 |
| 2017/0214387 A1 | 7/2017 | Burak et al. | |
| 2017/0288121 A1 | 10/2017 | Burak et al. | |
| 2017/0288122 A1 | 10/2017 | Zou et al. | |
| 2017/0288628 A1 | 10/2017 | Grannen et al. | |
| 2017/0288636 A1 | 10/2017 | Zou et al. | |
| 2017/0338799 A1 | 11/2017 | Ruby et al. | |
| 2018/0115302 A1* | 4/2018 | Yeh | H03H 9/175 |
| 2018/0294794 A1* | 10/2018 | Liu | H03H 3/02 |

\* cited by examiner

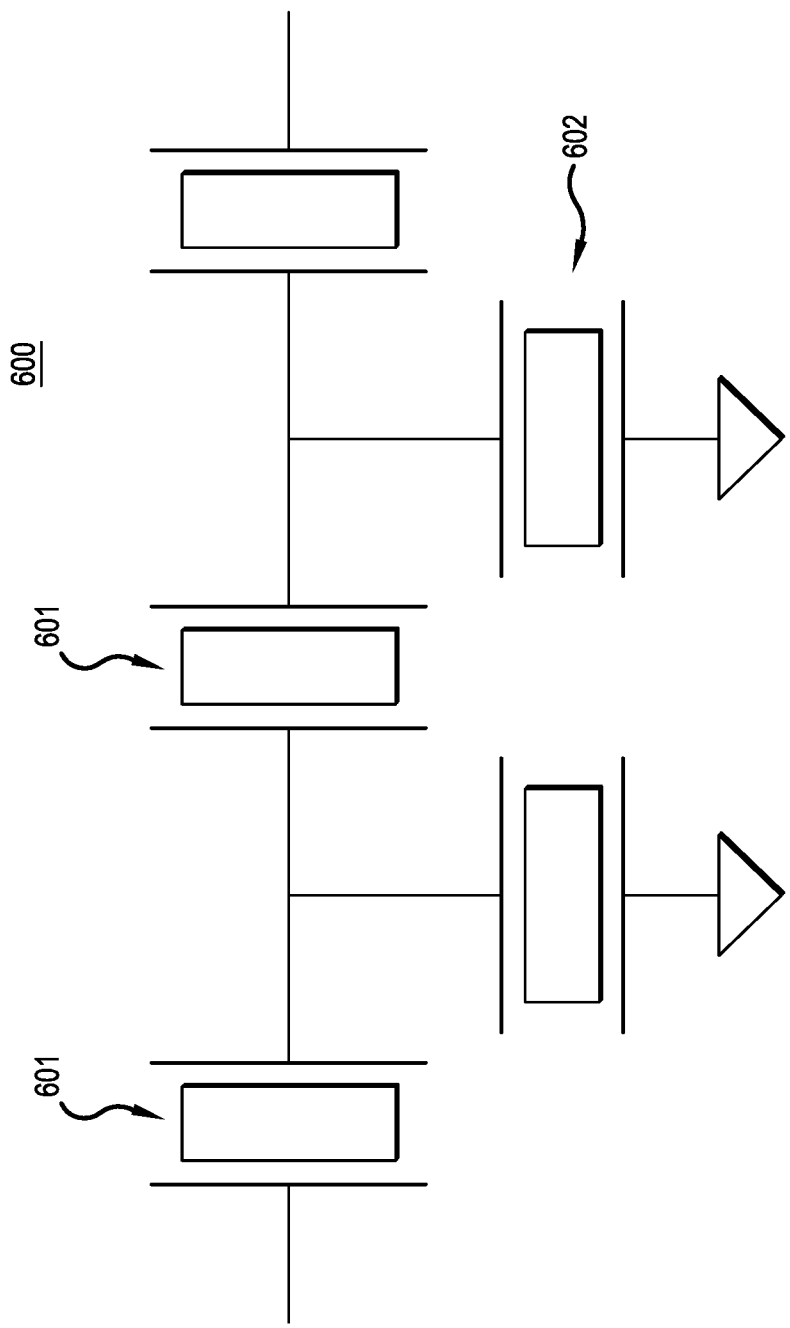

BULK ACOUSTIC WAVE RESONATORS HAVING LOW ATOMIC WEIGHT METAL ELECTRODES

BACKGROUND

In many electronic applications, electrical resonators are used. For example, in many wireless communications devices, radio frequency (rf) and microwave frequency resonators are used as filters to improve reception and transmission of signals. Filters typically include inductors and capacitors, and more recently resonators.

As will be appreciated, it is desirable to reduce the size of components of electronic devices. Many known filter technologies present a barrier to overall system miniaturization. With the need to reduce component size, a class of resonators based on the piezoelectric effect has emerged. In piezoelectric-based resonators, acoustic resonant modes are generated in the piezoelectric material. These acoustic waves are converted back and forth from acoustical and electrical waves for use in electrical applications.

Various types of filters use mechanical resonators, such as bulk acoustic wave (BAW) resonators, including film bulk acoustic resonators (FBARs) and solidly mounted resonators (SMRs), or surface acoustic wave (SAW) resonators. The resonators convert electrical signals to mechanical signals or vibrations, and/or mechanical signals or vibrations to electrical signals. A BAW resonator, for example, is an acoustic device comprising a stack that generally includes a layer of piezoelectric material between two electrodes. Acoustic waves achieve resonance across the acoustic stack, with the resonant frequency of the waves being determined by the materials in the acoustic stack and the thickness of each layer (e.g., piezoelectric layer and electrode layers).

Desirably, the BAW resonator excites only thickness-extensional (TE) modes, which are longitudinal mechanical waves having propagation (k) vectors in the direction of propagation. The TE modes desirably travel in the direction of the thickness of the piezoelectric layer. Less commonly used acoustic resonators employ the thickness shear (TS) modes, which are horizontally or vertically polarized shear waves having propagation (k) vectors perpendicular to the shear direction. The TS modes also propagate desirably in the direction of thickness.

In general, the most important vibrational mode for radio frequency (RF) filter applications is the TE mode, which is in parallel with an electrical field or perpendicular to the BAW resonator surface. The longitudinal mode is activated by a varying electrical voltage across the BAW resonator, and therefore the electrical field displacement charges (i.e., dipoles, consisting of positive and negative charged areas in the AlN film), resulting in contraction and expantion dependent on the direction of the electrical field. At a certain frequency, vibration of the dipoles is out of phase with the electrical field, where series resonance occurs and its correspondent frequency is called series resonant frequency (Fs). Where the vibration is totally in phase with the electrical field (i.e., 0° phase difference between the phases of the vibration and the electric field), the resonator reaches to parallel resonance, and its corresponding frequency is called parallel resonant frequency, (Fp).

As frequency and power requirements in BAW resonator-based devices (e.g., filters) continue to change, certain performance parameters can be compromised using known BAW resonator structures.

What is needed, therefore, is a BAW resonator that overcomes at least the shortcomings of known BAW resonators described above.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

FIG. 6 shows a simplified schematic diagram of an electrical filter in accordance with a representative embodiment.

DETAILED DESCRIPTION

Figure 1A:
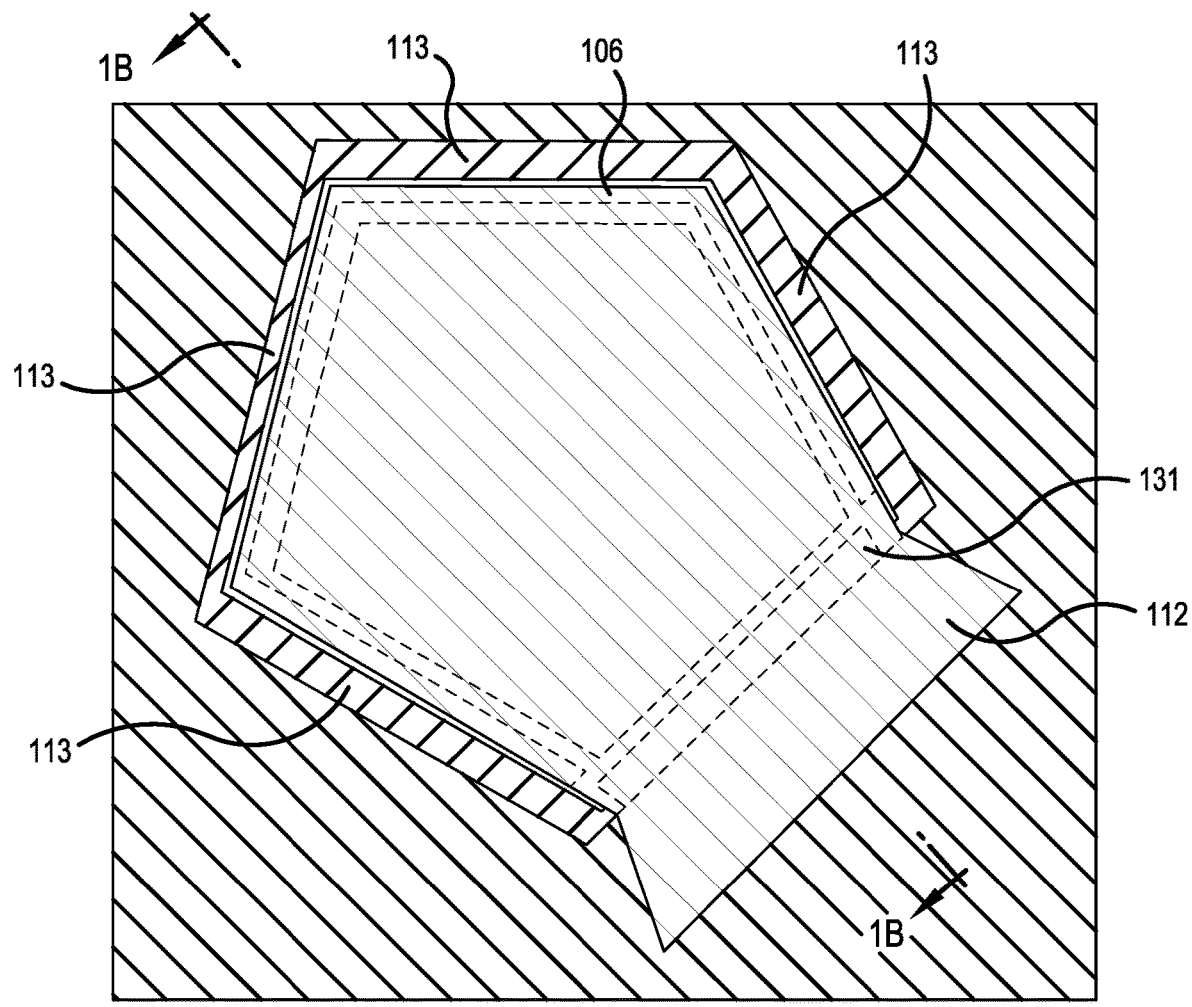
FIG. 1A shows a top view of a bulk acoustic wave (BAW) resonator in accordance with a representative embodiment.

In the following detailed description, for purposes of explanation and not limitation, specific details are set forth in order to provide a thorough understanding of illustrative embodiments according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the illustrative embodiments. Such methods and apparatuses are clearly within the scope of the present teachings.

It is to be understood that the terminology used herein is for purposes of describing particular embodiments only, and is not intended to be limiting. Any defined terms are in addition to the technical and scientific meanings of the defined terms as commonly understood and accepted in the technical field of the present teachings.

As used in the specification and appended claims, the terms 'a', 'an' and 'the' include both singular and plural referents, unless the context clearly dictates otherwise. Thus, for example, 'a device' includes one device and plural devices.

As used in the specification and appended claims, and in addition to their ordinary meanings, the terms 'substantial' or 'substantially' mean to with acceptable limits or degree. For example, 'substantially cancelled' means that one skilled in the art would consider the cancellation to be acceptable.

As used in the specification and the appended claims and in addition to its ordinary meaning, the term 'approximately' means to within an acceptable limit or amount to one having ordinary skill in the art. For example, 'approximately the same' means that one of ordinary skill in the art would consider the items being compared to be the same.

Relative terms, such as "above," "below," "beneath," "top," "bottom," "upper" and "lower" may be used to describe the various elements' relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be "below" that element. Similarly, if the device were rotated by 90° with respect to the view in the drawings, an element described "above" or "below" another element would now be "adjacent" to the other element; where "adjacent" means either abutting the other element, or having one or more layers, materials, structures, etc., between the elements.

In general, in the following detailed description, for purposes of explanation and not limitation, specific details are set forth in order to provide a thorough understanding of illustrative embodiments according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the illustrative embodiments. Such methods and apparati are clearly within the scope of the present teachings.

Generally, the present teachings relate to BAW resonators, and devices (e.g., electrical filters) that comprise the BAW resonators. A BAW resonator according to a representative embodiment of the present teachings comprises an acoustic stack, which comprises: a substrate comprising an acoustic reflector; a first electrode disposed over the acoustic reflector, and comprising a first electrode layer comprising a comparatively high acoustic impedance material, and a second electrode layer comprising a comparatively low acoustic impedance; a piezoelectric layer disposed over the second electrode layer; and a second electrode disposed over the piezoelectric layer, and comprising a third electrode layer comprising the low acoustic impedance, and a fourth electrode layer comprising the comparatively high acoustic impedance material and being disposed directly on the piezoelectric layer, wherein a total thickness of the acoustic stack is approximately $\lambda/2$, wherein $\lambda$ is a wavelength corresponding to a thickness extensional resonance frequency of the BAW resonator.

In accordance with another representative embodiment, the acoustic stack, comprises: a substrate comprising an acoustic reflector; a first beryllium electrode disposed over the acoustic reflector; a piezoelectric layer disposed over the first beryllium electrode; and a second beryllium electrode disposed over the piezoelectric layer.

FIG. 1A is a top view of a BAW resonator 100 in accordance with a representative embodiment. While a first ("lower") electrode, and a second ("upper) electrode with an optional passivation layer (see FIG. 1B) disposed thereover are components of the BAW resonator 100, these and other features are better shown in FIGS. 1B-5. The second electrode of the present embodiment is illustratively apodized to reduce acoustic losses. FIG. 1A also shows a cantilevered portion 106 disposed along all sides of the second electrode 104, except an interconnection side 112, where a bridge 131 is disposed.

The second electrode comprises non-connecting sides 113 and interconnection side 112. In a representative embodiment, cantilevered portions 106 are provided along each non-contacting side 113 and have the same width. This is merely illustrative, and it is contemplated that at least one side 113, but not all comprise a cantilevered portion 106. Furthermore, it is contemplated that the second electrode comprises more or fewer than four sides as shown. For example, a pentagonal-shaped second electrode is contemplated comprising four sides with cantilevered portions on one or more of the sides, and the fifth side providing the interconnection side. In a representative embodiment, the shape of the first electrode is substantially identical to the shape of the second electrode. Notably, the first electrode may comprise a larger area than the second electrode, and the shape of the first electrode may be different than the shape of the second electrode.

Figure 1B:
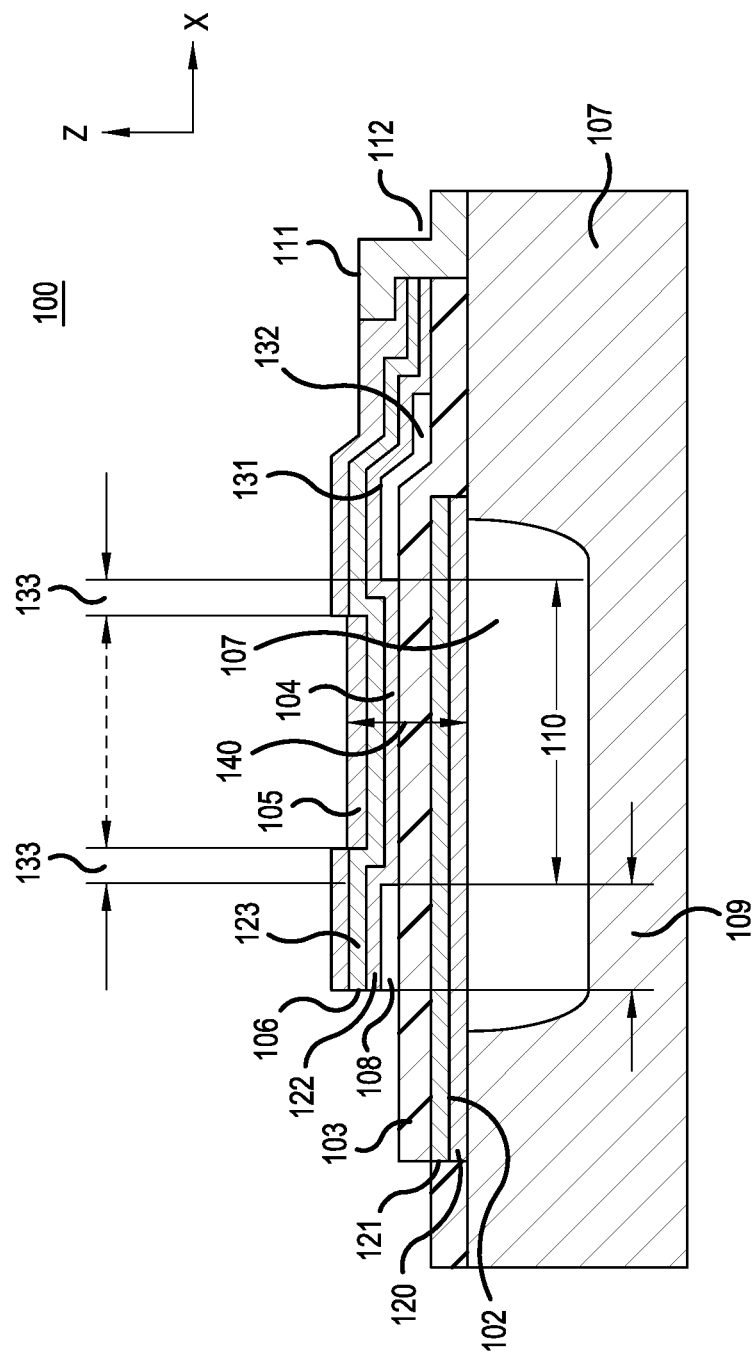
FIG. 1B shows a cross-sectional view of the BAW resonator of FIG. 1 taken along the line 1B-1B.

FIG. 1B shows a cross-sectional view of BAW resonator 100 depicted in FIG. 1A, and along the line 1B-1B. The BAW resonator 100 comprises a substrate 101 with a cavity 107 disposed therein. As will be appreciated by one of ordinary skill in the art, a BAW resonator, which includes a cavity 107 for an acoustic reflector, is often referred to as an FBAR. By contrast, and as described in connection with a representative embodiment of FIG. 2, use of a distributed Bragg reflector, comprising a plurality of alternating high acoustic impedance and low acoustic impedance layers, for the acoustic reflector is referred to as a surface mount resonator (SMR).

The first electrode 102 disposed beneath a piezoelectric layer 103, which comprises a first surface in contact with a first electrode 102 and a second surface in contact with a second electrode 104. An optional passivation layer 105 is provided over the second electrode 104. As will become clearer as the present description continues, in some embodiments, the passivation layer 105 is required. In accordance with a representative embodiment, the passivation layer 105 is AlN. In other representative embodiments, the passivation layer 105 could be silicon carbide (SiC), BSG, $SiO_2$, SiN, or polysilicon. The thickness of the passivation layer 105 should generally be sufficient to protect the layers of acoustic stack 140 from chemical reactions with the substances that may enter through a leak in the package.

A cantilevered portion 106 of the second electrode 104 is provided on at least one side of the second electrode 104. The cantilevered portion 106 may also be referred to as a 'wing.'

The BAW resonator further comprises the bridge 131 along the interconnection side 112. The bridge 131 provides the gap 132, which may be a void (e.g., air) or may be filled with a low acoustic impedance material. In addition to the bridge 131, the BAW resonator 100 comprises raised frame elements 133 (commonly referred to as an 'outie'). The raised frame element 133 may be provided over one or more sides of the BAW resonator 100 and provides an acoustic mismatch at the boundary of the second electrode 104, thereby improving signal reflections at the boundary and reducing acoustic losses. While the raised frame elements 133 are shown disposed over the second electrode 104, these features may instead be provided over the first electrode 102 and beneath the piezoelectric layer 103, or selectively on both the first and second electrodes 102,104.

The region of contacting overlap of the first and second electrodes 102, 104, the piezoelectric layer 103 and the cavity 107, or other reflector (e.g., Bragg reflector (not shown)) is referred to as an active area 110 of the BAW resonator 100. By contrast, an inactive area of the acoustic resonator comprises a region of overlap between first electrode 102 or second electrode 104, or both, and the piezoelectric layer 103 not disposed over the cavity 107, or other suspension structure, or acoustic mirror. As described more fully in the parent application, it is beneficial to the performance of the BAW resonator 100 to reduce the area of the inactive region of the BAW resonator 100 to the extent practical.

The cantilevered portion 106 extends beyond an edge of the active area 110 by a width 109 as shown. An electrical contact 111 is connected to a signal line (not shown) and electronic components (not shown) selected for the particular application of the BAW resonator 100. This portion of the BAW resonator 100 comprises an interconnection side 112 of the BAW resonator 100. As will become clearer as the present description continues, the interconnection side 112 of the second electrode 104 to which the electrical contact 111 is made does not comprise a cantilevered portion. By contrast, one or more non-connecting sides of the BAW resonator 100 may comprise cantilevered portions 106 that extend beyond the edge of the active area 110.

The cantilevered portion 106 of the second electrode 104 extends over a gap 108, which illustratively comprises air. In a representative embodiment, a sacrificial layer (not shown) is deposited by known technique over the first electrode 102 and a portion of the piezoelectric layer 103. The second electrode 104 and passivation layer 105 are provided over the sacrificial layer. After the formation of the second electrode 104 and passivation layer 105, the sacrificial layer is etched away illustratively with hydrofluoric acid leaving the cantilevered portion 106. In a representative embodiment, the sacrificial layer provided to form the cantilevered portion 106 and the sacrificial layer provided to form the cavity 107 are removed in the same process step.

Notably, rather than air, the gap 108 may comprise other materials including low acoustic impedance materials, such as carbon (C) doped $SiO_2$, which is also referred as Blackdiamond; or dielectric resin commercially known as SiLK; or benzocyclobutene (BCB). Such low acoustic impedance materials may be provided in the gap 108 by known methods. The low acoustic impedance material may be provided after removal of sacrificial material used to form the gap 108, or may be used instead of the sacrificial material in the gap 108, and not removed.

A variety of devices, structures thereof, materials and methods of fabrication are contemplated for the BAW resonators of the present teachings. Various details of such FBAR and SMR devices contemplated for use as the BAW resonators of the present teachings, and corresponding methods of fabrication may be found, for example, in one or more of the following U.S. patent documents: U.S. Pat. No. 6,107,721, to Lakin; U.S. Pat. Nos. 5,587,620, 5,873,153, 6,507,983, 7,388,454, 7,629,865, 7,714,684, 8,436,516, 9,479,139, 9,444,428, 6,060,818, 6,060,818C1 (Ex Parte Reexamination Certificate) and U.S. Patent Application Publication Nos. 20130015747, 20170155373, 20170085247 and 20150145610 to Ruby et al.; U.S. Pat. Nos. 7,369,013, 7,791,434, 8,188,810, and 8,230,562 to Fazzio, et al.; U.S. Pat. Nos. 7,280,007, 9,455,681 and 9,520,855 and U.S. Patent Application Publication No. 20140174908 to Feng et al.; U.S. Pat. Nos. 8,248,185 and 8,902,023 and U.S. Patent Application Publication No. 20120326807 to Choy, et al.; U.S. Pat. Nos. 7,345,410, 9,136,819 and 9,602,073 and U.S. Patent Application Publication Nos. 20170288628, 20150326200 and 20150240349 to Grannen, et al.; U.S. Pat. Nos. 6,828,713 and 9,088,265 and U.S. Patent Application Publication No. 20160352306 and U.S. Pat. No. 9,917,567 to Bradley, et al.; U.S. Pat. Nos. 7,561,009, 7,358,831, 9,243,316, 8,673,121 and 9,679,765 and U.S. Patent Application Publication No. 20140246305 to Larson, III et al.; U.S. Pat. Nos. 9,197,185, 9,450,167, 9,590,165, 9,401,691 and 9,590,165 and U.S. Patent Application Publication Nos. 20170288636, 20170288122 and 20160126930 to Zou, et al.; U.S. Pat. Nos. 8,981,876, and 8,390,397 to Jamneala et al.; U.S. Pat. Nos. 9,484,882, 9,571,063, 9,621,126, 9,691,963, 9,698,754, 9,608,594, 9,634,642, 9,548,438, 9,698,753, 9,577,603, 9,525,397, 9,748,918, 9,484,882, 9,571,064, 9,490,418, and 9,634,642, and U.S. Patent Application Publication Nos. 20170288121, 20170214387, 20170047907, 20160308509, 20160079958 and 20150280687 to Burak, et al.; U.S. Pat. Nos. 9,768,353 and 9,564,553 to Katona, et al.; U.S. Patent Application Publication Nos. 20160352308 and 20160191015 to Ivira, et al.; U.S. Pat. No. 9,680,445 to Barfknecht, et al.; U.S. Patent Application Publication No. 20150349745 to Small; U.S. Patent Application Publication No. 20150311046 to Yeh, et al.; U.S. Patent Application Publication No. 20150280688 to Ortiz, et al.; U.S. Pat. No. 9,680,439 and U.S. Patent Application Publication No. 20150247232 to Nikkel, et al.; U.S. Pat. No. 9,667,220 to Sridaran, et al.; U.S. Pat. No. 9,608,592 to Bi, et al.; and U.S. patent application Ser. No. 15/661,468 to Ruby, et al., and filed on Jun. 27, 2017. The entire disclosure of each of the patents, patent application publications, and patent application listed above are hereby specifically incorporated by reference herein. It is emphasized that the components, materials and methods of fabrication described in these patents and patent applications are representative, and other methods of fabrication and materials within the purview of one of ordinary skill in the art are also contemplated.

The first electrode 102 comprises a first electrode layer 120 and a second electrode layer 121. As described more fully herein, the first electrode layer 120 comprises a comparatively high acoustic impedance material, and the second electrode layer 121 comprises a comparatively low acoustic impedance material.

The second electrode 104 comprises a third electrode layer 122 and a fourth electrode layer 123. As described more fully herein, the third electrode layer 122 comprises a comparatively low acoustic impedance material, and the fourth electrode layer 123 comprises a comparatively high acoustic impedance material.

Notably, however, in certain representative embodiments, the high and low acoustic impedance materials are 'swapped' from that presented in the representative embodiment of FIG. 1B. As such, in such embodiments the first electrode layer 120 comprises a comparatively low acoustic impedance material, and the second electrode layer 121 comprises a comparatively high acoustic impedance material; and the third electrode layer 122 comprises a comparatively high acoustic impedance material, and the fourth electrode layer 123 comprises a comparatively low acoustic impedance material. In such a representative embodiment, some improvement in electrical conductivity is realized, but not much improvement of acoustic losses is gained because the portion of the BAW resonator 100 that is at or near the air interface this portion of the BAW resonator 100 has comparatively low stress. As such, an acoustically lossy (i.e., comparatively low acoustic impedance) material does not adversely impact the Q of the resonator. The piezoelectric layer 103 is illustratively a highly-textured piezoelectric material selected for various useful properties to the BAW resonator 100. By way of example, the piezoelectric layer 103 comprises aluminum nitride (AlN), although other materials such as zinc oxide are contemplated.

In various embodiments, the piezoelectric layer 103 is, illustratively, a layer of rare-earth element doped piezoelectric material (piezoelectric layer), such as AlScN, with an enhanced piezoelectric coefficient $d_{33}$ and an enhanced electromechanical coupling coefficient $kt^2$ by incorporating one or more rare-earth elements into the crystal lattice of a portion of the piezoelectric layer. By incorporating specific atomic percentages of the multiple rare-earth elements, the piezoelectric properties of the rare-earth element doped AlN, including piezoelectric coefficient $d_{33}$ and enhanced electromechanical effective coupling coefficient $kt^2$, are improved as compared to entirely stoichiometric (undoped) AlN.

The use of doped piezoelectric material (e.g., AScN) can improve the piezoelectric coupling coefficient of a BAW resonator, which in turn improves the bandwidth of a filter including the BAW resonator. Alternatively, scaling down the thickness of the piezoelectric layer 103 will reduce the effective coupling and resonator area while improving the Q of the resonator, which results in better insertion loss. This helps to reduce the cost of devices for low frequency applications. These improvements can also be useful, for instance, in Universal Mobile Telecommunications System (UMTS) bands 3 and 8, to produce better insertion loss while maintaining high attenuation at high frequencies. The improved insertion loss and attenuation in these bands may be beneficial, due to reduced battery power required for the transmitter filter and better sensitivity in the receiver section due to lower insertion loss in the receive filter. This often means longer battery life and fewer dropped calls in a wireless device.

In representative embodiments, the doped piezoelectric material in the piezoelectric layer 103 comprises doped AlN, and a number of Al atoms within the AlN crystal lattice are replaced with a rare-earth element at a predetermined percentage, referred to as a "doping element." In various embodiments, AlN material may be doped with scandium (Sc), for example, creating an AlScN compound with a predetermined atomic percentage of Sc. The Sc atom has an atomic radius that is larger than the atomic radius of the Al atom, resulting in a Sc—N bond length (2.25 Å) that is greater than the Al—N bond length (1.90 Å). This difference in bond lengths causes stress in the resulting AlScN material. Because the doping elements replace only Al atoms (e.g., of an Al target), the percentage of nitrogen atoms in the piezoelectric material remains substantially the same regardless of the amount of doping. As such, the AlScN material is represented stoichiometrically ($Al_{1-x}Sc_xN$; $0<x<1$). As such, when percentages of doping elements are discussed herein, it is in reference to the total atoms (not including nitrogen) of the AlN piezoelectric material, and is referred to herein as "atomic percentage." In accordance with certain representative embodiments, the atomic percentage of scandium in an aluminum nitride layer is approximately 3.0% to approximately 40.0%. As such, the atomic consistency of the piezoelectric layer 103 may then be represented as $Al_{0.6}Sc_{0.4}N$. More generally, the atomic percentage of scandium in an aluminum nitride layer is approximately 0.5% to approximately 44% in certain embodiments. In yet other representative embodiments, the atomic percentage of scandium in an aluminum nitride layer is approximately 2.5% to less than approximately 5.0%.

As described more fully below, the selection of the atomic doping percentage of scandium (or other suitable dopant), as well as the thickness of, the piezoelectric layer 103 may be made to achieve a trade-off of various parameters in the design of the BAW resonator 100.

In certain alternative embodiments, one of the piezoelectric layer 103 could be formed of a different piezoelectric material such as pure (i.e., undoped) AlN, zinc oxide (ZnO), lead zirconium titanate (PZT), gallium nitride (GaN), indium phosphide (InP), or gallium phosphide (GaP), for example. Additionally, one of the piezoelectric layers could be formed by modifying one of the above piezoelectric materials to further include certain types of rare earth metals, such as lanthanum or various lanthanum compounds such as $La_3Ga_5SiO_{14}$, and erbium.

In accordance with a representative embodiment the comparatively low acoustic impedance material is beryllium (Be), and the comparatively high acoustic impedance material comprises either tungsten (W) or molybdenum (Mo). As such, in accordance with a representative embodiment, first electrode layer 120 is either tungsten (W) or molybdenum (Mo), and the second electrode layer 121, on which the piezoelectric layer 103 is directly disposed, is beryllium (Be). Similarly, in accordance with a representative embodiment the third electrode layer 122 is beryllium, and is disposed directly on the piezoelectric layer. The fourth electrode layer 123 is either tungsten (W) or molybdenum (Mo). As such, the second and third electrode layers 121, 122 have a low acoustic impedance compared to the first and fourth electrode layers 120, 123.

As will be appreciated by one of ordinary skill in the art, the interface of the piezoelectric layer and the electrodes directly in contact therewith can be fraught with mechanical stress and strain. This strain is manifest in bulk acoustic losses, which in certain known BAW resonators, can amount to approximately one-half or more of the acoustic losses of the BAW resonator. For example, materials such as tungsten or molybdenum, which are often used as the sole electrode material, and are in immediate contact with the piezoelectric layer, have comparatively high acoustic stress and strain. During operation of such known BAW resonators, the acoustic strain at the interface can result in comparatively high acoustic losses, and consequently and less than desirable Q-factor.

Another source of loss in known BAW resonators is electrical in nature. For example, resistive losses through known electrodes adversely impact the return loss of the known BAW resonator. Again, using the example of tungsten as the sole material for electrodes in known BAW resonators, the comparatively high resistivity of the tungsten results in resistive losses, and thus increases return loss. This in turn, can undesirably reduce $R_p$ while increasing $R_p$.

By the present teachings, improvements are made in not only acoustic losses, but also electrical losses of BAW resonator 100, through the use of beryllium for the second and third electrode layers 121, 122 of the present teachings. By contrast to many known materials used for the only material in electrodes in known BAW resonators, the beryllium of the second and third electrode layers 121, 122 of the first and second electrodes 102, 104 has comparatively low bulk attenuation and acoustic impedance, which manifest in reduced acoustic losses in the BAW resonator of the present teachings compared to known BAW resonators.

Similarly, the electrical conductivity of beryllium, and therefore the second and third electrode layers 121, 122, is high compared, for example, to that of electrodes of known BAW resonators that comprise only tungsten or only molybdenum. As can be appreciated, a reduction in resistive losses through the use of beryllium for the second and third electrode layers 121, 122 is manifest in an improvement in the insertion loss of BAW resonator 100 compared to known BAW resonators, which use only tungsten or only molybdenum.

Another benefit of the use of beryllium for the second and third electrode layers 121, 122 is thermal dissipation. As can be appreciated, the increased demand for devices with greater power ratings results in increased heat generation. Because of the high thermal conductivity compared to tungsten or molybdenum, the beryllium of the second and third electrode layers 121, 122 fosters improved thermal dissipation of heat generated by the BAW resonator 100 when compared to known BAW resonators with only tungsten or only molybdenum electrodes. Ultimately, this improved heat dissipation fosters increased power capabilities of devices (e.g., filters) that include BAW resonator 100.

Beryllium also has a low bulk acoustic attenuation compared to many materials used for the electrodes of known BAW resonators. As such, by using beryllium for the second and third electrode layers 121, 122 at the respective interfaces with the piezoelectric layer 103, reduced acoustic attenuation occurs in the BAW resonator 100, and thereby reduced bulk acoustic losses compared to known BAW resonators.

In accordance with a representative embodiment, the first electrode layer 120 of the first electrode 102, and the fourth electrode layer 123 are made of either tungsten or molybdenum, which have comparatively high shear moduli. In certain embodiments, the first and fourth electrode layers 120, 123 of a representative embodiment is tungsten, which has a higher shear modulus than molybdenum, and therefore suppresses undesired lateral modes. Notably, in certain known BAW resonators the electrodes are made of solely of molybdenum rather than solely of tungsten because of the relative electrical conductivities of these materials for the benefit of electrical performance (insertion loss) and thermal dissipation. However, molybdenum has a lower shear modulus than tungsten. As such, the selection of molybdenum as the only material for the electrodes of certain known BAW resonators is realized at the cost of increased losses to spurious modes (and a lower Q) compared to known BAW resonators that use only tungsten for the electrodes. As such, in known BAW resonators, a trade-off of improved electrical performance at the expense of acoustic performance often is made by the selection of molybdenum as the material for the electrodes. However, and by contrast, because of the improved electrical conductivity of beryllium compared to molybdenum, the second and third electrode layers 121, 122, tungsten (W) or similar comparatively high acoustic impedance material may be used, resulting in a lower losses to spurious modes (and comparatively improved Q) compared to known BAW resonators that use only molybdenum for the electrodes of a known BAW resonator.

In accordance with a representative embodiment, the thickness of beryllium each of the second and third electrode layers 121, 122 is in the range of approximately 3000 Å to approximately 5000 Å. In a representative embodiment, the first and fourth electrode layers 120, 123 is tungsten, and each of first and fourth electrode layers 120, 123 has a thickness in the range of approximately 1000 Å to approximately 6000 Å. Finally, the piezoelectric layer 103 has a thickness in the range approximately 2500 Å to approximately 1.4 μm. Moreover, and as described more fully below, the thicknesses of the first~fourth electrode layers 120-123 and the piezoelectric layer 103, and the doping of the piezoelectric layer 103 (e.g., AScN) can be tailored to accommodate for various parameters for design optimization of BAW resonator 100.

As noted above, the acoustic stack 140 of BAW resonator 100 has a thickness (z-direction of the coordinate system of FIG. 1B) of approximately is approximately $\lambda/2$, where $\lambda$ is a wavelength corresponding to a desired thickness extensional resonance frequency of the BAW resonator 100. In known BAW resonators having a single electrode material (e.g., W or Mo), the thickness of the acoustic stack 140 is made up approximately 25% for each electrode, and 50% for the piezoelectric layer. By the present teachings, generally, the second and third electrode layers 121, 122 replace 20%-40% of the thickness of the single-material electrode with an equivalent mass of beryllium. Just by way of example, in a representative embodiment, a thickness of 500 Å of tungsten can be replaced by an equivalent mass (approximately 3000 Å) of beryllium. In accordance with a representative embodiment, the portion of the overall thickness of the first and second electrodes 102, 104 made up by the second and third electrode layers 121,122 that is beryllium is governed by certain competing parameters, and is selected based on certain desired results. For example, increasing the portion of the thickness of the first and second electrodes 102, 104 made up by the second and third electrode layers 121,122, which are beryllium, will improve the thermal conductivity (and thus heat dissipation) and electrical resistance (and thus insertion loss). However, because of the comparatively low acoustic impedance of beryllium, the electromechanical coupling coefficient ($kt^2$) is also comparatively reduced. As is known, the electromechanical coupling coefficient $kt^2$ indicates the efficiency of energy transfer between electrodes and the piezoelectric materials. This coefficient influences insertion loss and bandwidth of the BAW resonator 100 and devices (e.g., filters) incorporating the BAW resonator 100. Accordingly, the desired improvement in acoustic losses (and corresponding improvement in Q), and the improvement in thermal and electrical properties realized by the use of beryllium must be weighed against the reduction in the electromechanical coupling coefficient $kt^2$.

In specific representative embodiments, while keeping the frequency of the BAW resonator 100 constant, the "replacing" or "substituting" with beryllium (Be) of a portion of molybdenum (Mo) or tungsten (W) in a known electrode can be effected with considerations of the location of the comparatively low acoustic impedance material (e.g., Be) in the acoustic stack 140. As noted above, in certain representative embodiments, the second and third electrode layers 121, 122 comprise comparatively low acoustic impedance material (e.g., Be), and the first and fourth electrode layers 120, 123 comprise comparatively high acoustic impedance material (e.g., Mo or W). As noted above, in other representative embodiments, the second and third electrode layers 121, 122 comprise comparatively high acoustic impedance material, and the first and fourth electrode layers 120, 123 comprise comparatively low acoustic impedance material. Stated somewhat differently, in the former embodiment, the comparatively low acoustic impedance material electrode layers are disposed nearer to the middle (i.e., at a point of high stress, where very little motion occurs, and where the stiffness of the material that is an important consideration) of the acoustic stack 140 (i.e., sandwiching the piezoelectric layer 103), whereas in the latter embodiment, the low acoustic impedance material layers are disposed near the top and bottom of the acoustic stack 140 (i.e., at or near the interface of the acoustic stack 140 with air).

In the representative embodiment where the second and third electrode layers 121, 122 comprise comparatively low acoustic impedance material (e.g., Be), the portion of tungsten (W) or molybdenum (Mo) of a known resonator electrode that is "replaced" by beryllium (Be) (again for constant frequency) can be determined based on a ratio of the velocity of sound ratio of the two materials. Just by way of example, in such an embodiment, the ratio of the sound velocity ratio beryllium (Be) to molybdenum (Mo) is approximately 2.5:1. This equates to replacing 1 unit of thickness of molybdenum with approximately 2.5 units of thickness of Be. So, approximately 2.5 Å of beryllium (Be) "replaces" 1.0 Å of molybdenum (Mo). Similarly, the ratio of sound velocity ratio beryllium (Be) to tungsten (W), is approximately 2.3:1. So, approximately 2.3 Å beryllium (Be) "replaces" 1.0 Å of tungsten (W) when the second and third electrode layers 121, 122 comprise the comparatively low acoustic impedance material (Be).

In the representative embodiment in which the first and fourth electrodes 120, 123 comprise the comparatively low acoustic impedance materials (i.e., at or near the interface with air, where the mass of the material governs), the ratio of densities gives the correct substitution ratio to keep frequency constant the portion of tungsten (W) or molybdenum (Mo) of a known resonator electrode that is "replaced" by beryllium (Be) can be determined based on a ratio of the density of the two materials (Be, and W or Mo). So, by way of example, and in such an embodiment, ratio of the density of molybdenum (Mo) to beryllium (Be) is approximately 5:1. This equates to replacing 1 unit of thickness of molybdenum with approximately 5 units of thickness of Be. So, approximately 5 Å of beryllium (Be) "replaces" 1.0 Å of molybdenum (Mo). Similarly, the ratio of densities ratio beryllium (Be) to tungsten (W), is approximately 10:1. So, approximately 10 Å beryllium (Be) "replaces" 1.0 Å of tungsten (W).

Finally, and as alluded to above, significant design considerations for acoustic resonators include, among other things, chip area. There are various factors that affect each of these considerations. The use of doped piezoelectric material (e.g., AScN) can improve the piezoelectric coupling coefficient of a BAW resonator, which in turn improves the bandwidth of a filter including the BAW resonator. Alternatively, scaling down the thickness of the piezoelectric layer 103 will reduce the effective coupling and resonator area while improving the Q of the resonator, which results in better insertion loss. For example, in accordance with a representative embodiment, the selection of a comparatively high atomic percentage of scandium doping in the AScN layer that comprises piezoelectric layer 103 can be made to compensate for a reduction in the electromechanical coupling coefficient $kt^2$ when a thicker layer of beryllium is used for the second and third electrode layers 121,122. Alternatively, providing second and third electrode layers 121, 122 of beryllium, first and fourth electrode layers 120, 123 of tungsten, and a comparatively high atomic percentage of scandium doping in the AScN layer that comprises piezoelectric layer 103 allows for a comparatively thin piezoelectric layer 103 and a reduced areal dimension of the BAW resonator 100 with acceptable electromechanical coupling coefficient $kt^2$, reduced acoustic losses, reduced resistive losses, and improved thermal dissipation.

Figure 2:
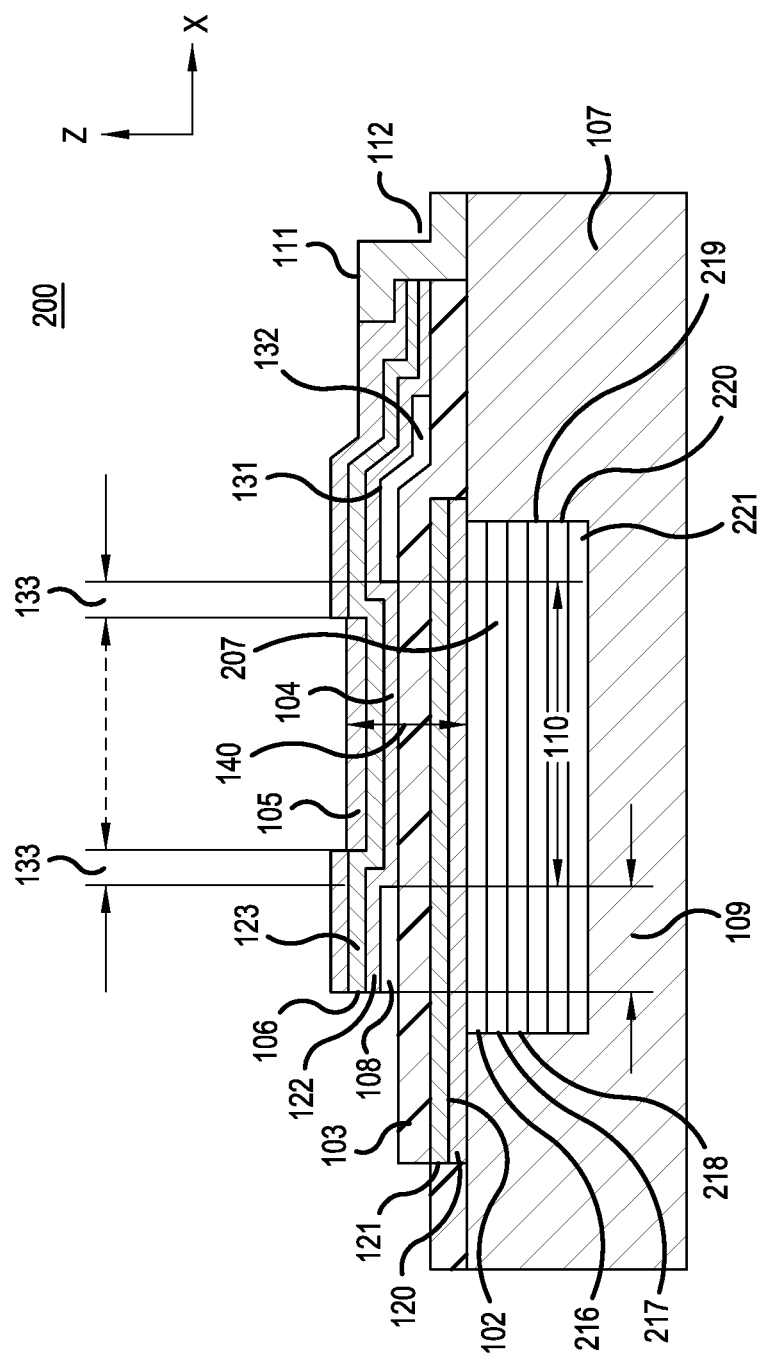
FIG. 2 shows a cross-sectional view of a BAW resonator in accordance with a representative embodiment.

FIG. 2 shows a cross-sectional view of a BAW resonator 200 in accordance with a representative embodiment. The BAW resonator 200 is substantively the same as BAW resonator 100, except that instead of a cavity in the substrate 101, the BAW resonator 200 comprises a distributed Bragg reflector (DBR), comprising a plurality of alternating high acoustic impedance and low acoustic impedance layers 216-221 for the acoustic reflector. As such, the BAW resonator 200 is an SMR.

The first electrode 102 disposed beneath the piezoelectric layer 103, which comprises a first surface in contact with the first electrode 102 and a second surface in contact with the second electrode 104. An optional passivation layer 105 is provided over the second electrode 104. In accordance with a representative embodiment, the passivation layer 105 is AlN. In other representative embodiments, the passivation layer 105 could be silicon carbide (SiC), BSG, $SiO_2$, SiN, or polysilicon. The thickness of the passivation layer should generally be sufficient to protect the layers of acoustic stack 140 from chemical reactions with the substances that may enter through a leak in the package.

A cantilevered portion 106 of the second electrode 104 is provided on at least one side of the second electrode 104. The cantilevered portion 106 may also be referred to as a 'wing.'

The BAW resonator further comprises the bridge 131 along the interconnection side 112. The bridge 131 provides the gap 132, which may be a void (e.g., air) or may be filled with a low acoustic impedance material. In addition to the bridge 131, the BAW resonator 100 comprises raised frame elements 133 (commonly referred to as an 'outie'). The raised frame element 133 may be provided over one or more sides of the BAW esonator 500 and provides an acoustic mismatch at the boundary of the second electrode 104, thereby improving signal reflections at the boundary and reducing acoustic losses. While the raised frame elements 133 are shown disposed over the second electrode 104, these features may instead be provided over the first electrode 102 and beneath the piezoelectric layer 103, or selectively on both the first and second electrodes 102,104.

The BAW resonator further comprises the bridge 131 along the interconnection side 112. The bridge 131 provides the gap 132, which may be a void (e.g., air) or may be filled with a low acoustic impedance material. In addition to the bridge 131, the BAW resonator 100 comprises raised frame elements 133 (commonly referred to as an 'outie'). The raised frame element 133 may be provided over one or more sides of the BAW resonator 500 and provides an acoustic mismatch at the boundary of the second electrode 104, thereby improving signal reflections at the boundary and reducing acoustic losses. While the raised frame elements 133 are shown disposed over the second electrode 104, these features may instead be provided over the first electrode 102 and beneath the piezoelectric layer 103, or selectively on both the first and second electrodes 102,104.

The region of contacting overlap of the first and second electrodes 102, 104, the piezoelectric layer 103 and the cavity 107, or other reflector (e.g., Bragg reflector (not shown)) is referred to as the active area 110 of the BAW resonator 100. By contrast, an inactive area of the acoustic resonator comprises the region of overlap between first electrode 102 or second electrode 104, or both, and the piezoelectric layer 103 not disposed over the cavity 107, or other suspension structure, or acoustic mirror. As described more fully in the parent application, it is beneficial to the performance of the BAW resonator 100 to reduce the area of the inactive region of the BAW resonator 100 to the extent practical.

The cantilevered portion 106 extends beyond an edge of the active area 110 by the width 109 as shown. An electrical contact 111 is connected to a signal line (not shown) and electronic components (not shown) selected for the particular application of the BAW resonator 100. This portion of the BAW resonator 100 comprises the interconnection side 112 of the BAW resonator 100. As will become clearer as the present description continues, the interconnection side 112 of the second electrode 104 to which the electrical contact 111 is made does not comprise the cantilevered portion. By contrast, one or more non-connecting sides of the BAW resonator 100 may comprise cantilevered portions 106 that extend beyond the edge of the active area 110.

The cantilevered portion 106 of the second electrode 104 extends over the gap 108, which illustratively comprises air. In a representative embodiment, a sacrificial layer (not shown) is deposited by known technique over the first electrode 102 and a portion of the piezoelectric layer 103. The second electrode 104 and passivation layer 105 are provided over the sacrificial layer. After the formation of the second electrode 104 and passivation layer 105, the sacrificial layer is etched away illustratively with hydrofluoric acid leaving the cantilevered portion 106. In a representative embodiment, the sacrificial layer provided to form the cantilevered portion 106 and the sacrificial layer provided to form the cavity 107 are removed in the same process step.

Notably, rather than air, the gap 108 may comprise other materials including low acoustic impedance materials, such as carbon (C) doped $SiO_2$, which is also referred to as Black-diamond; or dielectric resin commercially known as SiLK; or benzocyclobutene (BCB). Such low acoustic impedance materials may be provided in the gap 108 by known methods. The low acoustic impedance material may be provided after removal of sacrificial material used to form the gap 108, or may be used instead of the sacrificial material in the gap 108, and not removed.

The first electrode 102 comprises the first electrode layer 120 and the second electrode layer 121. As described more fully herein, the first electrode layer 120 comprises a comparatively high acoustic impedance material, and the second electrode layer 121 comprises a comparatively low acoustic impedance.

The second electrode 104 comprises the third electrode layer 122 and the fourth electrode layer 123. As described more fully herein, the third electrode layer 122 comprises the comparatively low acoustic impedance material, and the fourth electrode layer 123 comprises a comparatively high acoustic impedance.

As noted above, however, in certain representative embodiments, the high and low acoustic impedance materials are 'swapped' from that presented in the representative embodiment of FIG. 2. As such, in such embodiments the first electrode layer 120 comprises a comparatively low acoustic impedance material, and the second electrode layer 121 comprises a comparatively high acoustic impedance material; and the third electrode layer 122 comprises a comparatively high acoustic impedance material, and the fourth electrode layer 123 comprises a comparatively low acoustic impedance material. In such a representative embodiment, some improvement in electrical conductivity is realized, but not much improvement of acoustic losses is gained because the portion of the BAW resonator 100 that is at or near the air interface this portion of the BAW resonator 100 has comparatively low stress. As such, an acoustically lossy (i.e., comparatively low acoustic impedance) material does not adversely impact the Q of the resonator. The piezoelectric layer 103 is illustratively a highly-textured piezoelectric material selected for various useful properties to the BAW resonator 100. By way of example, the piezoelectric layer 103 comprises aluminum nitride (AlN), although other materials such as zinc oxide are contemplated.

In various embodiments, the piezoelectric layer 103 is, illustratively, a layer of rare-earth element doped piezoelectric material (piezoelectric layer), such as AlScN, with an enhanced piezoelectric coefficient $d_{33}$ and an enhanced electromechanical coupling coefficient $kt^2$ by incorporating one or more rare-earth elements into the crystal lattice of a portion of the piezoelectric layer. By incorporating specific atomic percentages of the multiple rare-earth elements, the piezoelectric properties of the rare-earth element doped AlN, including piezoelectric coefficient $d_{33}$ and enhanced electromechanical effective coupling coefficient $kt^2$, are improved as compared to entirely stoichiometric (undoped) AlN.

The use of doped piezoelectric material (e.g., AScN) can improve the piezoelectric coupling coefficient of a BAW resonator, which in turn improves the bandwidth of a filter including the BAW resonator. Alternatively, scaling down the thickness of the piezoelectric layer 103 will reduce the effective coupling and resonator area while improving the Q of the resonator, which results in better insertion loss. This helps to reduce the cost of low frequency applications. These improvements can also be useful, for instance, in Universal Mobile Telecommunications System (UMTS) bands 3 and 8, to produce better insertion loss while maintaining high attenuation at high frequencies. The improved insertion loss and attenuation in these bands may be beneficial, due to reduced battery power required for the transmitter filter and better sensitivity in the receiver section due to lower insertion loss in the receive filter. This often means longer battery life and fewer dropped calls in a wireless device.

In representative embodiments, the doped piezoelectric material in the piezoelectric layer 103 comprises doped AlN, and a number of Al atoms within the AlN crystal lattice are replaced with a rare-earth element at a predetermined percentage, referred to as a "doping element." In various embodiments, AlN material may be doped with scandium (Sc), for example, creating an AlScN compound with a predetermined atomic percentage of Sc. The Sc atom has an atomic radius that is larger than the atomic radius of the Al atom, resulting in a Sc—N bond length (2.25 Å) that is greater than the Al—N bond length (1.90 Å). This difference in bond lengths causes stress in the resulting AlScN material. Because the doping elements replace only Al atoms (e.g., of an Al target), the percentage of nitrogen atoms in the piezoelectric material remains substantially the same regardless of the amount of doping. As such, the AlScN material is represented stoichiometrically ($Al_{1-x}Sc_xN$; $0<x<1$). As such, when percentages of doping elements are discussed herein, it is in reference to the total atoms (not including nitrogen) of the AlN piezoelectric material, and is referred to herein as "atomic percentage." In accordance with certain representative embodiments, the atomic percentage of scandium in an aluminum nitride layer is approximately 3.0% to approximately 40.0%. As such, the atomic consistency of the piezoelectric layer 103 may then be represented as $Al_{0.6}Sc_{0.4}N$. More generally, the atomic percentage of scandium in an aluminum nitride layer is approximately 0.5% to approximately 44% in certain embodiments. In yet other representative embodiments, the atomic percentage of scandium in an aluminum nitride layer is approximately 2.5% to less than approximately 5.0%.

As described more fully below, the selection of the atomic doping percentage of scandium (or other suitable dopant), as well as the thickness of, the piezoelectric layer 103 may be made to achieve a trade-off of various parameters in the design of the BAW resonator 100.

In certain alternative embodiments, one of the piezoelectric layer 103 could be formed of a different piezoelectric material such as pure (i.e., undoped) AlN, zinc oxide (ZnO), lead zirconium titanate (PZT), gallium nitride (GaN), indium phosphide (InP), or gallium phosphide (GaP), for example. Additionally, one of the piezoelectric layers could be formed by modifying one of the above piezoelectric materials to further include certain types of rare earth metals, such as lanthanum or various lanthanum compounds such as $La_3Ga_5SiO_{14}$, and erbium.

In accordance with a representative embodiment, the comparatively low acoustic impedance material is beryllium (Be), and the comparatively high acoustic impedance material comprises either tungsten (W) or molybdenum (Mo). As such, in accordance with a representative embodiment, the first electrode layer 120 is either tungsten (W) or molybdenum (Mo), and the second electrode layer 121, on which the piezoelectric layer 103 is directly disposed, is beryllium (Be). Similarly, in accordance with a representative embodiment the third electrode layer 122 is beryllium, and is disposed directly on the piezoelectric layer. The fourth electrode layer 123 is either tungsten (W) or molybdenum (Mo). As such, the second and third electrode layers 121, 122 have a low acoustic impedance compared to the first and fourth electrode layers 120, 123.

As will be appreciated by one of ordinary skill in the art, the interface of the piezoelectric layer and the electrodes directly in contact therewith can be fraught with mechanical stress and strain. This strain is manifest in bulk acoustic losses, which in certain known BAW resonators, can amount to approximately one-half or more of the acoustic losses of the BAW resonator. For example, materials such as tungsten or molybdenum, which are often used as the electrode in immediate contact with the piezoelectric layer, have comparatively high acoustic stress and strain. During operation of such known BAW resonators, the acoustic strain at the interface can result in comparatively high acoustic losses, and consequently and less than desirable Q-factor.

Another source of loss in known BAW resonators is electrical in nature. For example, resistive losses through known electrodes adversely impact the insertion loss of the known BAW resonator. Again, using the example of tungsten (only) electrodes in known BAW resonators, the comparatively high resistivity of the tungsten results in resistive losses, and thus diminished insertion loss.

By the present teachings, improvements are made in not only acoustic losses, but also electrical losses of BAW resonator 100, through the use of beryllium for the second and third electrode layers 121, 122 of the present teachings. By contrast to many known materials used for electrodes in known BAW resonators, the beryllium of the second and third electrode layers 121, 122 of the first and second electrodes 102, 104 has comparatively low bulk attenuation and acoustic impedance, which manifest in reduced acoustic losses in the BAW resonator of the present teachings compared to known BAW resonators.

Similarly, the electrical conductivity of beryllium, and therefore the second and third electrode layers 121, 122, is high compared, for example, to electrodes of known BAW resonators that comprise only tungsten or only molybdenum. As can be appreciated, a reduction in resistive losses through the use of beryllium for the second and third electrode layers 121, 122 is manifest in an improvement in the insertion loss of BAW resonator 100 compared to known BAW resonators, which use only tungsten or only molybdenum.

Another benefit of the use of beryllium for the second and third electrode layers 121, 122 is thermal dissipation. As can be appreciated, the increased demand for devices with greater power ratings results in increased heat generation. Because of the high thermal conductivity compared to tungsten or molybdenum, the beryllium of the second and third electrode layers 121, 122 fosters improved thermal dissipation of heat generated by the BAW resonator 100 when compared to known BAW resonators with only tungsten or only molybdenum electrodes. Ultimately, this improved heat dissipation fosters increased power capabilities of devices (e.g., filters) that include BAW resonator 100.

Beryllium also has a low bulk acoustic attenuation compared to many materials used for the electrodes of known BAW resonators. As such, by using beryllium for the second and third electrode layers 121, 122 at the respective interfaces with the piezoelectric layer 103, reduced acoustic attenuation occurs in the BAW resonator 100, and thereby reduced bulk acoustic losses compared to known BAW resonators.

In accordance with a representative embodiment, the first electrode layer 120 of the first electrode 102, and the fourth electrode layer 123 are made of either tungsten or molybdenum, which have comparatively high shear moduli. In certain embodiments, the first and fourth electrode layers 120, 123 of a representative embodiment is tungsten, which has a higher shear modulus than molybdenum, and therefore suppresses undesired lateral modes. Notably, in certain known BAW resonators the electrodes are made of (only) molybdenum rather than (only) tungsten because of the relative electrical conductivities of these materials for the benefit of electrical performance (insertion loss) and thermal dissipation. However, molybdenum has a lower high shear modulus than tungsten. As such, the selection of molybdenum for the electrodes of certain known BAW resonators is realized at the cost of increased losses to spurious modes (and a lower Q) compared to known BAW resonators that use only tungsten for the electrodes. As such, in known BAW resonators, a trade-off of improved electrical performance at the expense of acoustic performance often is made by the selection of molybdenum as the sole material for the electrodes. However, and by contrast, because of the improved electrical conductivity of beryllium compared to molybdenum, the second and third electrode layers 121, 122 result in reduced resistive losses, and improved insertion loss.

In accordance with a representative embodiment, the thickness of beryllium each of the second and third electrode layers 121, 122 is in the range of approximately 3000 Å to approximately 5000 Å. In a representative embodiment, the first and fourth electrode layers 120, 123 is tungsten, and each of first and fourth electrode layers 120, 123 has a thickness in the range of approximately 1000 Å to approximately 6000 Å. Finally, the piezoelectric layer 103 has a thickness in the range approximately 2500 Å to approximately 1.4 µm. Moreover, and as described more fully below, the thicknesses of the first~fourth electrode layers 120-123 and the piezoelectric layer 103, and the doping of the piezoelectric layer 103 (e.g., AScN) can be tailored to accommodate for various parameters for design optimization of BAW resonator 100.

As noted above, the acoustic stack 140 of BAW resonator 100 has a thickness (z-direction of the coordinate system of FIG. 2) of approximately is approximately λ/2, where λ is a wavelength corresponding to a desired thickness extensional resonance frequency of the BAW resonator 100. In known BAW resonators having a single electrode material (e.g., W or Mo), the thickness of the acoustic stack 140 is made up approximately 25% for each electrode, and 50% for the piezoelectric layer. By the present teachings, the second and third electrode layers 121, 122 replace 20%-40% of the thickness of the single-material electrode with an equivalent mass of beryllium. Just by way of example, in a representative embodiment, a thickness of 500 Å of tungsten can be replaced by an equivalent mass (approximately 3000 Å) of beryllium. In accordance with a representative embodiment, the portion of the overall thickness of the first and second electrodes 102, 104 made up by the second and third electrode layers 121,122 that is beryllium is governed by certain competing parameters, and is selected based on certain desired results. For example, increasing the portion of the over thickness of the first and second electrodes 102, 104 made up by the second and third electrode layers 121,122, which are beryllium, will improve the thermal conductivity (and thus heat dissipation) and electrical resistance (and thus insertion loss). However, because of the comparatively low acoustic impedance of beryllium, the electromechanical coupling coefficient ($kt^2$) is also comparatively reduced. As is known, the electromechanical coupling coefficient $kt^2$ indicates the efficiency of energy transfer between electrodes and the piezoelectric materials. This coefficient influences insertion loss and bandwidth of the BAW resonator 100 and devices (e.g., filters) incorporating the BAW resonator 100. Accordingly, the desired improvement in acoustic losses (and corresponding improvement in Q), and the improvement in thermal and electrical properties realized by the use of beryllium must be weighed against the reduction in the electromechanical coupling coefficient $kt^2$ (and thus Q).

Finally, and as alluded to above, significant design considerations for acoustic resonators include, among other things, chip area. There are various factors that affect each of these considerations. The use of doped piezoelectric material (e.g., AScN) can improve the piezoelectric coupling coefficient of a BAW resonator, which in turn improves the bandwidth of a filter including the BAW resonator. Alternatively, scaling down the thickness of the piezoelectric layer 103 will reduce the effective coupling and resonator area while improving the Q of the resonator, which results in better insertion loss. For example, in accordance with a representative embodiment, the selection of a comparatively high atomic percentage of scandium doping in the AScN layer that comprises piezoelectric layer 103 can be made to compensate for a reduction in the electromechanical coupling coefficient $kt^2$ when a thicker layer of beryllium is used for the second and third electrode layers 121,122. Alternatively, providing second and third electrode layers 121, 122 of beryllium, first and fourth electrode layers 120, 123 of tungsten, and a comparatively high atomic percentage of scandium doping in the AScN layer that comprises piezoelectric layer 103 allows for a comparatively thin piezoelectric layer 103 and a reduced areal dimension of the BAW resonator 100 with acceptable electromechanical coupling coefficient $kt^2$, reduced acoustic losses, reduced resistive losses, and improved thermal dissipation.

Figure 3:
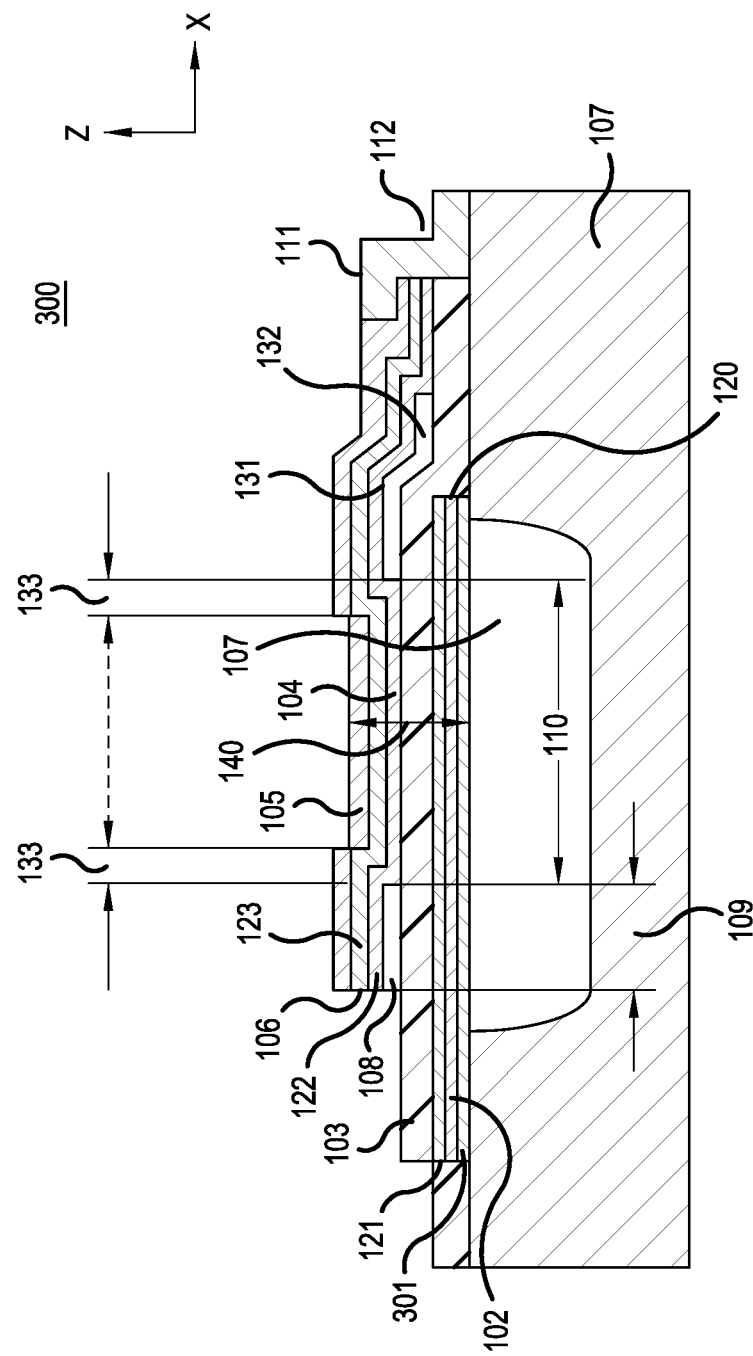
FIG. 3 shows a cross-sectional view of a BAW resonator in accordance with a representative embodiment.

FIG. 3 shows a cross-sectional view of a BAW resonator 300 in accordance with a representative embodiment. Many aspects and details of BAW resonator 500 are common to those of BAW resonators 100, 200 described above in connection with various representative embodiments. These aspects and details may not be repeated in the description of BAW resonator 300, but are relevant to this representative embodiment nonetheless.

The BAW resonator 300 comprises substrate 101 with the cavity 107 disposed therein. The first electrode 102 is disposed beneath the piezoelectric layer 103 (sometimes referred to herein as "second piezoelectric layer"), which comprises a first surface in contact with the first electrode 102 and a second surface in contact with the second electrode 104. The passivation layer 105 is provided over the second electrode 104. In accordance with a representative embodiment, the passivation layer 105 is a piezoelectric material such as undoped AlN, and may be referred to herein as a third piezoelectric layer for reasons that will become clearer as the present description continues. The thickness of the passivation layer should generally be sufficient to protect the layers of acoustic stack 140 from chemical reactions with the substances that may enter through a leak in the package. In accordance with a representative embodiment, the passivation layer is undoped AlN, and has a thickness in the range of approximately 1500 Å to approximately 3000 Å in order to address surface roughness and to provide protection during ion milling methods used to adjust the frequency of the BAW resonator 300.

The cantilevered portion 106 of the second electrode 104 is provided on at least one side of the second electrode 104. The BAW resonator 300 further comprises the bridge 131 along the interconnection side 112. The bridge 131 provides the gap 132, which may be a void (e.g., air) or may be filled with a low acoustic impedance material. In addition to the bridge 131, the BAW resonator 100 comprises raised frame elements 133 (commonly referred to as an 'outie'). The raised frame element 133 may be provided over one or more sides of the BAW resonator 300 and provides an acoustic mismatch at the boundary of the second electrode 104, thereby improving signal reflections at the boundary and reducing acoustic losses. While the raised frame elements 133 are shown disposed over the second electrode 104, these features may instead be provided over the first electrode 102 and beneath the piezoelectric layer 103, or selectively on both the first and second electrodes 102,104.

The first electrode 102 comprises a first electrode layer 120 and a second electrode layer 121. A first piezoelectric layer 301 is disposed beneath the first electrode layer 120. As described more fully herein, the first electrode layer 120 comprises a comparatively high acoustic impedance material, and the second electrode layer 121 comprises a comparatively low acoustic impedance material. The first piezoelectric layer 301 functions as a seed layer to foster growth of the highly-textured first piezoelectric layer 103. In accordance with a representative embodiment, the second piezoelectric layer is undoped AlN having a thickness of approximately 300 Å.

The second electrode 104 comprises a third electrode layer 122 and a fourth electrode layer 123. As described more fully herein, the third electrode layer 122 comprises a comparatively low acoustic impedance material, and the fourth electrode layer 123 comprises a comparatively high acoustic impedance material.

Notably, however, in certain representative embodiments, the high and low acoustic impedance materials are 'swapped' from that presented in the representative embodiment of FIG. 3. As such, in such embodiments the first electrode layer 120 comprises a comparatively low acoustic impedance material, and the second electrode layer 121 comprises a comparatively high acoustic impedance material; and the third electrode layer 122 comprises a comparatively high acoustic impedance material, and the fourth electrode layer 123 comprises a comparatively low acoustic impedance material. In such a representative embodiment, some improvement in electrical conductivity is realized, but not much improvement of acoustic losses is gained because the portion of the BAW resonator 100 that is at or near the air interface this portion of the BAW has comparatively low stress. As such, an acoustically lossy (i.e., comparatively low acoustic impedance) does not adversely impact the Q of the resonator.

The piezoelectric layer 103 is illustratively a highly-textured piezoelectric material selected for various useful properties to the BAW resonator 100. By way of example, the piezoelectric layer 103 comprises aluminum nitride (AlN), although other materials such as zinc oxide are contemplated.

In various embodiments, the piezoelectric layer 103 is, illustratively, a layer of rare-earth element doped piezoelectric material (piezoelectric layer), such as AlScN, with an enhanced piezoelectric coefficient $d_{33}$ and an enhanced electromechanical coupling coefficient $kt^2$ by incorporating one or more rare-earth elements into the crystal lattice of a portion of the piezoelectric layer. By incorporating specific atomic percentages of the multiple rare-earth elements, the piezoelectric properties of the rare-earth element doped AlN, including piezoelectric coefficient $d_{33}$ and enhanced electromechanical effective coupling coefficient $kt^2$, are improved as compared to entirely stoichiometric (undoped) AlN.

In accordance with a representative embodiment the comparatively low acoustic impedance material is beryllium (Be), and the comparatively high acoustic impedance material comprises either tungsten (W) or molybdenum (Mo). As such, in accordance with a representative embodiment, first electrode layer 120 is either tungsten (W) or molybdenum (Mo), and the second electrode layer 121, on which the piezoelectric layer 103 is directly disposed, is beryllium (Be). Similarly, in accordance with a representative embodiment the third electrode layer 122 is beryllium, and is disposed directly on the piezoelectric layer. The fourth electrode layer 123 is either tungsten (W) or molybdenum (Mo). As such, the second and third electrode layers 121, 122 have a low acoustic impedance compared to the first and fourth electrode layers 120, 123.

As will be appreciated by one of ordinary skill in the art, the interface of the piezoelectric layer and the electrodes directly in contact therewith can be fraught with mechanical stress and strain. This strain is manifest in bulk acoustic losses, which in certain known BAW resonators, can amount to approximately one-half or more of the acoustic losses of the BAW resonator. For example, materials such as tungsten or molybdenum, which are often used as the only material in the electrodes of certain known BAW resonators, and are in immediate contact with the piezoelectric layer, have comparatively high acoustic stress and strain. During operation of such known BAW resonators, the acoustic strain at the interface can result in comparatively high acoustic losses, and consequently and less than desirable Q-factor.

Another source of loss in known BAW resonators is electrical in nature. For example, resistive losses through known electrodes adversely impact the return loss of the known BAW resonator. Again, using the example of tungsten electrodes in known BAW resonators, the comparatively high resistivity of the tungsten results in resistive losses, and thus increase return loss.

By the present teachings, improvements are made in not only acoustic losses, but also electrical losses of BAW resonator 100, through the use of beryllium for the second and third electrode layers 121, 122 of the present teachings. By contrast to many known materials used for electrodes in known BAW resonators, the beryllium of the second and third electrode layers 121, 122 of the first and second electrodes 102, 104 has comparatively low bulk attenuation and acoustic impedance, which manifest in reduced acoustic losses in the BAW resonator of the present teachings compared to known BAW resonators.

Similarly, the electrical conductivity of beryllium, and therefore the second and third electrode layers 121, 122, is high compared, for example, to that of electrodes of known BAW resonators that comprise only tungsten or only molybdenum. As can be appreciated, a reduction in resistive losses through the use of beryllium for the second and third electrode layers 121, 122 is manifest in an improvement in the insertion loss of BAW resonator 100 compared to known BAW resonators, which use only tungsten or only molybdenum.

Another benefit of the use of beryllium for the second and third electrode layers 121, 122 is thermal dissipation. As can be appreciated, the increased demand for devices with greater power ratings results in increased heat generation. Because of the high thermal conductivity compared to tungsten or molybdenum, the beryllium of the second and third electrode layers 121, 122 fosters improved thermal dissipation of heat generated by the BAW resonator 100 when compared to known BAW resonators with only tungsten or only molybdenum electrodes. Ultimately, this improved heat dissipation fosters increased power capabilities of devices (e.g., filters) that include BAW resonator 100.

Beryllium also has a low bulk acoustic attenuation compared to many materials used for the electrodes of known BAW resonators. As such, by using beryllium for the second and third electrode layers 121, 122 at the respective interfaces with the piezoelectric layer 103, reduced acoustic attenuation occurs in the BAW resonator 100, and thereby reduced bulk acoustic losses compared to known BAW resonators.

In accordance with a representative embodiment, the first electrode layer 120 of the first electrode 102, and the fourth electrode layer 123 are made of either tungsten or molybdenum, which have comparatively high shear moduli. In certain embodiments, the first and fourth electrode layers 120, 123 of a representative embodiment is tungsten, which has a higher shear modulus than molybdenum, and therefore suppresses undesired lateral modes. Notably, in certain known BAW resonators the electrodes are made of only molybdenum rather than only tungsten because of the relative electrical conductivities of these materials for the benefit of electrical performance (insertion loss) and thermal dissipation. However, molybdenum has a lower shear modulus than tungsten. As such, the selection of molybdenum for the electrodes of certain known BAW resonators is realized at the cost of increased losses to spurious modes (and a lower Q) compared to known BAW resonators that use only tungsten for the electrodes. As such, in known BAW resonators, a trade-off of improved electrical performance at the expense of acoustic performance often is made by the selection of molybdenum as the material for the electrodes. However, and by contrast, because of the improved electrical conductivity of beryllium compared to molybdenum, the second and third electrode layers 121, 122, tungsten (W) or similar comparatively high acoustic impedance material may be used, resulting in a lower losses to spurious modes (and comparatively improved Q) compared to known BAW resonators that use only molybdenum for the electrodes of a known BAW resonator.

In accordance with a representative embodiment, the thickness of beryllium each of the second and third electrode layers 121, 122 is in the range of approximately 3000 Å to approximately 5000 Å. In a representative embodiment, the first and fourth electrode layers 120, 123 is tungsten, and each of first and fourth electrode layers 120, 123 has a thickness in the range of approximately 1000 Å to approximately 6000 Å. Finally, the piezoelectric layer 103 has a thickness in the range approximately 2500 Å to approximately 1.4 µm. Moreover, and as described more fully below, the thicknesses of the first~fourth electrode layers 120-123 and the piezoelectric layer 103, and the doping of the piezoelectric layer 103 (e.g., AScN) can be tailored to accommodate for various parameters for design optimization of BAW resonator 100.

As noted above, the acoustic stack 140 of BAW resonator 100 has a thickness (z-direction of the coordinate system of FIG. 3) of approximately is approximately $\lambda/2$, where $\lambda$ is a wavelength corresponding to a desired thickness extensional resonance frequency of the BAW resonator 100. In known BAW resonators having a single electrode material (e.g., W or Mo), the thickness of the acoustic stack 140 is made up approximately 25% for each electrode, and 50% for the piezoelectric layer. By the present teachings, the second and third electrode layers 121, 122 replace 20%-40% of the thickness of the single-material electrode with an equivalent mass of beryllium. Just by way of example, in a representative embodiment, a thickness of 500 Å of tungsten can be replaced by an equivalent mass (approximately 3000 Å) of beryllium. In accordance with a representative embodiment, the portion of the overall thickness of the first and second electrodes 102, 104 made up by the second and third electrode layers 121,122 that is beryllium is governed by certain competing parameters, and is selected based on certain desired results. For example, increasing the portion of the over thickness of the first and second electrodes 102, 104 made up by the second and third electrode layers 121,122, which are beryllium, will improve the thermal conductivity (and thus heat dissipation) and electrical resistance (and thus insertion loss). However, because of the comparatively low acoustic impedance of beryllium, the electromechanical coupling coefficient ($kt^2$) is also comparatively reduced. As is known, the electromechanical coupling coefficient $kt^2$ indicates the efficiency of energy transfer between electrodes and the piezoelectric materials. This coefficient influences insertion loss and bandwidth of the BAW resonator 100 and devices (e.g., filters) incorporating the BAW resonator 100. Accordingly, the desired improvement in acoustic losses (and corresponding improvement in Q), and the improvement in thermal and electrical properties realized by the use of beryllium must be weighed against the reduction in the electromechanical coupling coefficient $kt^2$.

As noted above, the acoustic stack 140 of BAW resonator 100 has a thickness (z-direction of the coordinate system of FIG. 3) of approximately is approximately $\lambda/2$, where $\lambda$ is a wavelength corresponding to a desired thickness extensional resonance frequency of the BAW resonator 100. In known BAW resonators having a single electrode material (e.g., W or Mo), the thickness of the acoustic stack 140 is made up approximately 25% for each electrode, and 50% for the piezoelectric layer. By the present teachings, generally, the second and third electrode layers 121, 122 replace 20%-40% of the thickness of the single-material electrode with an equivalent mass of beryllium. Just by way of example, in a representative embodiment, a thickness of 500 Å of tungsten can be replaced by an equivalent mass (approximately 3000 Å) of beryllium. In accordance with a representative embodiment, the portion of the overall thickness of the first and second electrodes 102, 104 made up by the second and third electrode layers 121,122 that is beryllium is governed by certain competing parameters, and is selected based on certain desired results. For example, increasing the portion of the thickness of the first and second electrodes 102, 104 made up by the second and third electrode layers 121,122, which are beryllium, will improve the thermal conductivity (and thus heat dissipation) and electrical resistance (and thus insertion loss). However, because of the comparatively low acoustic impedance of beryllium, the electromechanical coupling coefficient ($kt^2$) is also comparatively reduced. As is known, the electromechanical coupling coefficient $kt^2$ indicates the efficiency of energy transfer between electrodes and the piezoelectric materials. This coefficient influences insertion loss and bandwidth of the BAW resonator 100 and devices (e.g., filters) incorporating the BAW resonator 100. Accordingly, the desired improvement in acoustic losses (and corresponding improvement in Q), and the improvement in thermal and electrical properties realized by the use of beryllium must be weighed against the reduction in the electromechanical coupling coefficient $kt^2$.

In specific representative embodiments, while keeping the frequency of the BAW resonator 100 constant, the "replacing" or "substituting" with beryllium (Be) of a portion of molybdenum (Mo) or tungsten (W) in a known electrode can be effected with considerations of the location of the comparatively low acoustic impedance material (e.g., Be) in the acoustic stack 140. As noted above, in certain representative embodiments, the second and third electrode layers 121, 122 comprise comparatively low acoustic impedance material (e.g., Be), and the first and fourth electrode layers 120, 123 comprise comparatively high acoustic impedance material (e.g., Mo or W). As noted above, in other representative embodiments, the second and third electrode layers 121, 122 comprise comparatively high acoustic impedance material, and the first and fourth electrode layers 120, 123 comprise comparatively low acoustic impedance material. Stated somewhat differently, in the former embodiment, the comparatively low acoustic impedance material electrode layers are disposed nearer to the middle (i.e., at a point of high stress, where very little motion occurs, and where the stiffness of the material that is an important consideration) of the acoustic stack 140 (i.e., sandwiching the piezoelectric layer 103), whereas in the latter embodiment, the low acoustic impedance material layers are disposed near the top and bottom of the acoustic stack 140 (i.e., at or near the interface of the acoustic stack 140 with air).

In the representative embodiment where the second and third electrode layers 121, 122 comprise comparatively low acoustic impedance material (e.g., Be), the portion of tungsten (W) or molybdenum (Mo) of a known resonator electrode that is "replaced" by beryllium (Be) (again for constant frequency) can be determined based on a ratio of the velocity of sound ratio of the two materials. Just by way of example, in such an embodiment, the ratio of the sound velocity ratio beryllium (Be) to molybdenum (Mo) is approximately 2.5:1. This equates to replacing 1 unit of thickness of molybdenum with approximately 2.5 units of thickness of Be. So, approximately 2.5 Å of beryllium (Be) "replaces" 1.0 Å of molybdenum (Mo). Similarly, the ratio of sound velocity ratio beryllium (Be) to tungsten (W), is approximately 2.3:1. So, approximately 2.3 Å beryllium (Be) "replaces" 1.0 Å of molybdenum (Mo) when the second and third electrode layers 121, 122 comprise the comparatively low acoustic impedance material (Be).

In the representative embodiment in which the first and fourth electrodes 120, 123 comprise the comparatively low acoustic impedance materials (i.e., at or near the interface with air, where the mass of the material governs), the ratio of densities gives the correct substitution ratio to keep frequency constant the portion of tungsten (W) or molybdenum (Mo) of a known resonator electrode that is "replaced" by beryllium (Be) can be determined based on a ratio of the density of the two materials (Be, and W or Mo). So, by way of example, and in such an embodiment, ratio of the density of molybdenum (Mo) to beryllium (Be) is approximately 5:1. This equates to replacing 1 unit of thickness of molybdenum with approximately 5 units of thickness of Be. So, approximately 5 Å of beryllium (Be) "replaces" 1.0 Å of molybdenum (Mo). Similarly, the ratio of the densities of beryllium (Be) to tungsten (W) is approximately 10:1. So, approximately 10 Å beryllium (Be) "replaces" 1.0 Å of tungsten (W).

Figure 4:
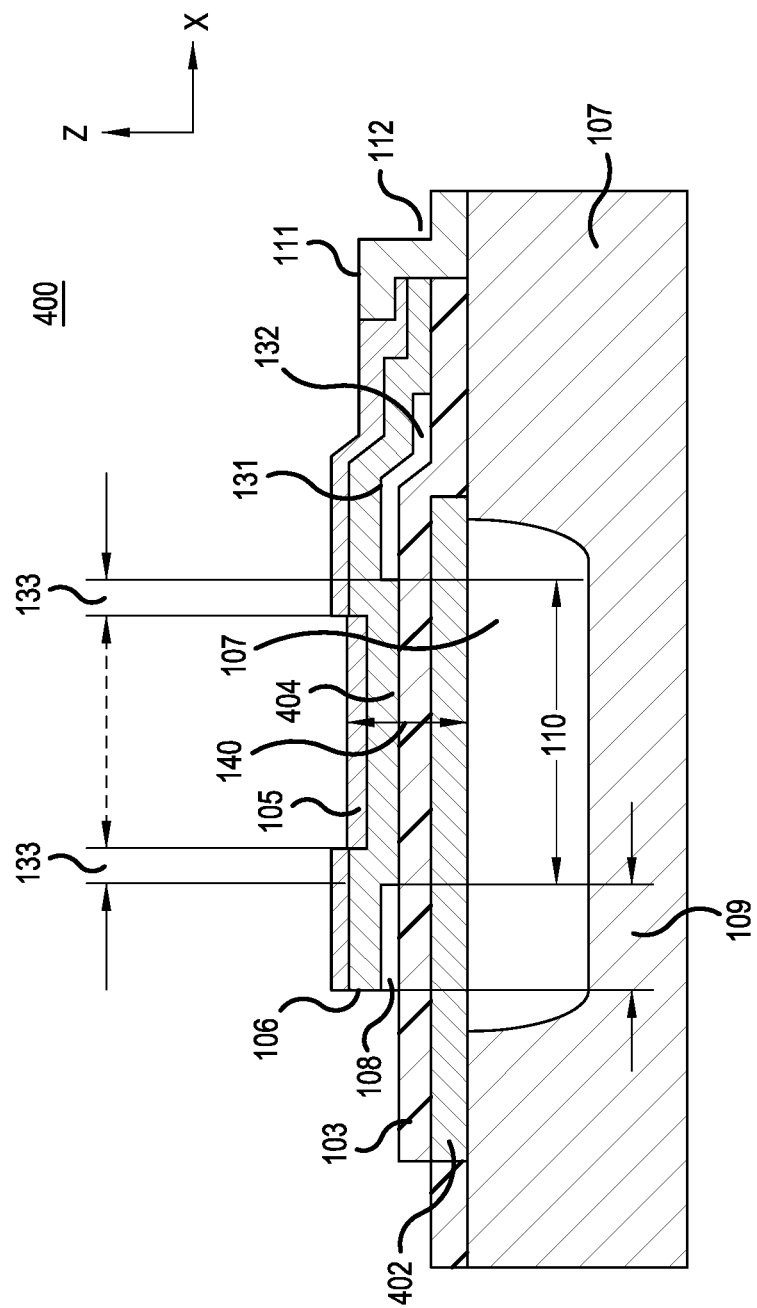
FIG. 4 shows a cross-sectional view of a BAW resonator in accordance with a representative embodiment.

FIG. 4 shows a cross-sectional view of a BAW resonator 400 in accordance with a representative embodiment. Many aspects and details of BAW resonator 400 are common to those of BAW resonators 100, 200, 300 described above in connection with various representative embodiments. These aspects and details may not be repeated in the description of BAW resonator 400, but are relevant to this representative embodiment nonetheless.

The BAW resonator 400 comprises substrate 101 with the cavity 107 disposed therein. A first electrode 402 is disposed beneath the piezoelectric layer 103, which comprises a first surface in contact with the first electrode 402 and a second surface in contact with a second electrode 404. The passivation layer 105 is provided over the second electrode 104. In accordance with a representative embodiment, the passivation layer 105 is a piezoelectric material such as AlN. In other representative embodiments, the passivation layer 105 could be silicon carbide (SiC), BSG, $SiO_2$, SiN, or polysilicon. The thickness of the passivation layer should generally be sufficient to protect the layers of acoustic stack 140 from chemical reactions with the substances that may enter through a leak in the package.

The cantilevered portion 106 of the second electrode 404 is provided on at least one side of the second electrode 404. The BAW resonator 400 further comprises the bridge 131 along the interconnection side 112. The bridge 131 provides the gap 132, which may be a void (e.g., air) or may be filled with a low acoustic impedance material. In addition to the bridge 131, the BAW resonator 400 comprises raised frame elements 133 (commonly referred to as an 'outie'). The raised frame element 133 may be provided over one or more sides of the BAW resonator 400 and provides an acoustic mismatch at the boundary of the second electrode 404, thereby improving signal reflections at the boundary and reducing acoustic losses. While the raised frame elements 133 are shown disposed over the second electrode 104, these features may instead be provided over the first electrode 402 and beneath the piezoelectric layer 103, or selectively on both the first and second electrodes 402, 404.

In accordance with a representative embodiment, the first and second electrodes 402, 404 are made solely of beryllium (Be). In accordance with a representative embodiment, the first and second electrodes 402, 404 have a thickness in the range of approximately 0.1 µm to approximately 2.0 µm, depending on the frequency of the BAW resonator 400.

As will be appreciated, reduction in resistive losses through the use of beryllium for the first and second electrodes 402, 404 is manifest in an improvement in the insertion loss of BAW resonator 400 compared to known BAW resonators, which use only tungsten or only molybdenum for the electrodes.

Another benefit of the use of beryllium for the first and second electrodes 402, 404 is thermal dissipation. As can be appreciated, the increased demand for devices with greater power ratings results in increased heat generation. Because of the high thermal conductivity compared to tungsten or molybdenum, the beryllium of the first and second electrodes 402, 404 fosters improved thermal dissipation of heat generated by the BAW resonator 400 when compared to known BAW resonators with only tungsten or only molybdenum electrodes. Ultimately, this improved heat dissipation fosters increased power capabilities of devices (e.g., filters) that include BAW resonator 100.

Figure 5:
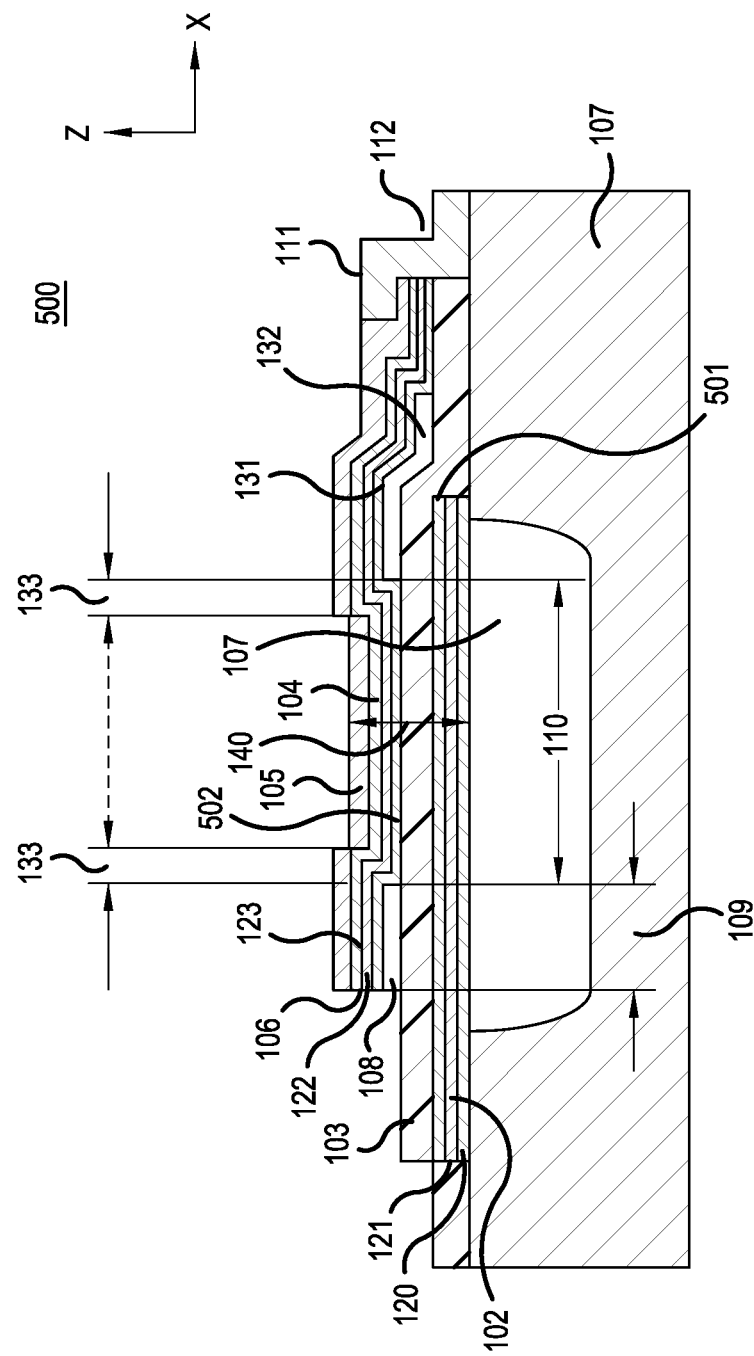
FIG. 5 shows a cross-sectional view of a BAW resonator in accordance with a representative embodiment.

FIG. 5 shows a cross-sectional view of a BAW resonator 500 in accordance with a representative embodiment. Many aspects and details of BAW resonator 500 are common to those of BAW resonators 100, 200 described above in connection with various representative embodiments. These aspects and details may not be repeated in the description of BAW resonator 500, but are relevant to this representative embodiment nonetheless.

The BAW resonator 500 comprises substrate 101 with the cavity 107 disposed therein. The first electrode 102 is disposed beneath the piezoelectric layer 103, which comprises a first surface in contact with the first electrode 102 and a second surface in contact with the second electrode 104. The passivation layer 105 is provided over the second electrode 104. In accordance with a representative embodiment, the passivation layer 105 is a piezoelectric material such as AlN. In other representative embodiments, the passivation layer 105 could be silicon carbide (SiC), BSG, $SiO_2$, SiN, or polysilicon. The thickness of the passivation layer should generally be sufficient to protect the layers of acoustic stack 140 from chemical reactions with the substances that may enter through a leak in the package.

The cantilevered portion 106 of the second electrode 104 is provided on at least one side of the second electrode 104. The BAW resonator 500 further comprises the bridge 131 along the interconnection side 112. The bridge 131 provides the gap 132, which may be a void (e.g., air) or may be filled with a low acoustic impedance material. In addition to the bridge 131, the BAW resonator 100 comprises raised frame elements 133 (commonly referred to as an 'outie'). The raised frame element 133 may be provided over one or more sides of the BAW resonator 500 and provides an acoustic mismatch at the boundary of the second electrode 104, thereby improving signal reflections at the boundary and reducing acoustic losses. While the raised frame elements 133 are shown disposed over the second electrode 104, these features may instead be provided over the first electrode 102 and beneath the piezoelectric layer 103, or selectively on both the first and second electrodes 102, 104.

The first electrode 102 comprises the first electrode layer 120, the second electrode layer 121, and a first barrier layer 501. As described more fully herein, the first electrode layer 120 and the first barrier layer 501 comprises a comparatively high acoustic impedance material, and the second electrode layer 121 comprises a comparatively low acoustic impedance.

The second electrode 104 comprises a second barrier layer 502, the third electrode layer 122 and the fourth electrode layer 123. As described more fully herein, the third electrode layer 122 comprises the comparatively low acoustic impedance material, and the second barrier layer 502 and the fourth electrode layer 123 comprises a comparatively high acoustic impedance.

The piezoelectric layer 103 is illustratively a highly-textured piezoelectric material selected for various useful properties to the BAW resonator 100. By way of example, the piezoelectric layer 103 comprises aluminum nitride (AlN), although other materials such as zinc oxide are contemplated.

In various embodiments, the piezoelectric layer 103 is, illustratively, a layer of rare-earth element doped piezoelectric material (piezoelectric layer), such as AlScN, with an enhanced piezoelectric coefficient $d_{33}$ and an enhanced electromechanical coupling coefficient $kt^2$ by incorporating one or more rare-earth elements into the crystal lattice of a portion of the piezoelectric layer. By incorporating specific atomic percentages of the multiple rare-earth elements, the piezoelectric properties of the rare-earth element doped AlN, including piezoelectric coefficient $d_{33}$ and enhanced electromechanical effective coupling coefficient $kt^2$, are improved as compared to entirely stoichiometric (undoped) AlN.

The use of doped piezoelectric material (e.g., AScN) can improve the piezoelectric coupling coefficient of a BAW resonator, which in turn improves the bandwidth of a filter including the BAW resonator. Alternatively, scaling down the thickness of the piezoelectric layer 103 will reduce the effective coupling and resonator area while improving the Q of the resonator, which results in better insertion loss. This helps to reduce the cost of low frequency applications. These improvements can also be useful, for instance, in Universal Mobile Telecommunications System (UMTS) bands 3 and 8, to produce better insertion loss while maintaining high attenuation at high frequencies. The improved insertion loss and attenuation in these bands may be beneficial, due to reduced battery power required for the transmitter filter and better sensitivity in the receiver section due to lower insertion loss in the receive filter. This often means longer battery life and fewer dropped calls in a wireless device.

In representative embodiments, the doped piezoelectric material in the piezoelectric layer 103 comprises doped AlN, and a number of Al atoms within the AlN crystal lattice are replaced with a rare-earth element at a predetermined percentage, referred to as a "doping element." In various embodiments, AlN material may be doped with scandium (Sc), for example, creating an AlScN compound with a predetermined atomic percentage of Sc. The Sc atom has an atomic radius that is larger than the atomic radius of the Al atom, resulting in a Sc—N bond length (2.25 Å) that is greater than the Al—N bond length (1.90 Å). This difference in bond lengths causes stress in the resulting AlScN material. Because the doping elements replace only Al atoms (e.g., of an Al target), the percentage of nitrogen atoms in the piezoelectric material remains substantially the same regardless of the amount of doping. As such, the AlScN material is represented stoichiometrically $(Al_{1-x}Sc_xN; 0<x<1)$. As such, when percentages of doping elements are discussed herein, it is in reference to the total atoms (not including nitrogen) of the AlN piezoelectric material, and is referred to herein as "atomic percentage." In accordance with certain representative embodiments, the atomic percentage of scandium in an aluminum nitride layer is approximately 3.0% to approximately 40.0%. As such, the atomic consistency of the piezoelectric layer 103 may then be represented as $Al_{0.6}Sc_{0.4}N$. More generally, the atomic percentage of scandium in an aluminum nitride layer is approximately 0.5% to approximately 44% in certain embodiments. In yet other representative embodiments, the atomic percentage of scandium in an aluminum nitride layer is approximately 2.5% to less than approximately 5.0%.

As described more fully below, the selection of the atomic doping percentage of scandium (or other suitable dopant), as well as the thickness of, the piezoelectric layer 103 may be made to achieve a trade-off of various parameters in the design of the BAW resonator 100.

In certain alternative embodiments, one of the piezoelectric layer 103 could be formed of a different piezoelectric material such as pure (i.e., undoped) AlN, zinc oxide (ZnO), lead zirconium titanate (PZT), gallium nitride (GaN), indium phosphide (InP), or gallium phosphide (GaP), for example. Additionally, one of the piezoelectric layers could be formed by modifying one of the above piezoelectric materials to further include certain types of rare earth metals, such as lanthanum or various lanthanum compounds such as $La_3Ga_5SiO_{14}$, and erbium.

In accordance with a representative embodiment, the comparatively low acoustic impedance material is beryllium (Be), and the comparatively high acoustic impedance material comprises either tungsten (W) or molybdenum (Mo). As such, in accordance with a representative embodiment, the first electrode layer 120 is either tungsten (W) or molybdenum (Mo), and the second electrode layer 121, on which the piezoelectric layer 103 is directly disposed, is beryllium (Be). Similarly, in accordance with a representative embodiment the third electrode layer 122 is beryllium, and is disposed directly on the piezoelectric layer. The fourth electrode layer 123 is either tungsten (W) or molybdenum (Mo). As such, the second and third electrode layers 121, 122 have a low acoustic impedance compared to the first and fourth electrode layers 120, 123.

As depicted in FIG. 5, the first barrier layer 501 and the first electrode layer 120 are disposed on either side of the second electrode layer 121. Similarly, the second barrier layer 502 and the fourth electrode layer 123 are disposed on either side of the third electrode layer 122. In accordance with a representative embodiment, the first and second barrier layers have a comparatively high acoustic impedance, and may be made of the same material as the first and fourth electrode layers 120, 123. As such, in accordance with a representative embodiment, first and second barrier layers 501, 502 are tungsten (W) or molybdenum (Mo), and protect the second and third electrode layers 121,122 from exposure. In an illustrative embodiment, the second and third electrode layers 121,122 are beryllium, the first and second barrier layers 501, 502 are tungsten (W).

As will be appreciated by one of ordinary skill in the art, the interface of the piezoelectric layer and the electrodes directly in contact therewith can be fraught with mechanical stress and strain. This strain is manifest in bulk acoustic losses, which in certain known BAW resonators, can amount to approximately one-half or more of the acoustic losses of the BAW resonator. For example, materials such as tungsten or molybdenum, which are often used as the electrode in immediate contact with the piezoelectric layer, have comparatively high acoustic stress and strain. During operation of such known BAW resonators, the acoustic strain at the interface can result in comparatively high acoustic losses, and consequently and less than desirable Q-factor.

Another source of loss in known BAW resonators is electrical in nature. For example, resistive losses through known electrodes adversely impact the insertion loss of the known BAW resonator. Again, using the example of tungsten electrodes in known BAW resonators, the comparatively high resistivity of the tungsten results in resistive losses, and thus diminished insertion loss.

By the present teachings, improvements are made in not only acoustic losses, but also electrical losses of BAW resonator 100, through the use of beryllium for the second and third electrode layers 121, 122 of the present teachings. By contrast to many known materials used for electrodes in known BAW resonators, the beryllium of the second and third electrode layers 121, 122 of the first and second electrodes 102, 104 has comparatively low bulk attenuation and acoustic impedance, which manifest in reduced acoustic losses in the BAW resonator of the present teachings compared to known BAW resonators.

Similarly, the electrical conductivity of beryllium, and therefore the second and third electrode layers 121, 122, is high compared, for example, to electrodes of known BAW resonators that comprise only tungsten or only molybdenum. As can be appreciated, a reduction in resistive losses through the use of beryllium for the second and third electrode layers 121, 122 is manifest in an improvement in the insertion loss of BAW resonator 100 compared to known BAW resonators, which use only tungsten or only molybdenum.

Another benefit of the use of beryllium for the second and third electrode layers 121, 122 is thermal dissipation. As can be appreciated, the increased demand for devices with greater power ratings results in increased heat generation. Because of the high thermal conductivity compared to tungsten or molybdenum, the beryllium of the second and third electrode layers 121, 122 fosters improved thermal dissipation of heat generated by the BAW resonator 100 when compared to known BAW resonators with only tungsten or only molybdenum electrodes. Ultimately, this improved heat dissipation fosters increased power capabilities of devices (e.g., filters) that include BAW resonator 100.

Beryllium also has a low bulk acoustic attenuation compared to many materials used for the electrodes of known BAW resonators. As such, by using beryllium for the second and third electrode layers 121, 122 at the respective interfaces with the piezoelectric layer 103, reduced acoustic attenuation occurs in the BAW resonator 100, and thereby reduced bulk acoustic losses compared to known BAW resonators.

In accordance with a representative embodiment, the first electrode layer 120 of the first electrode 102, and the fourth electrode layer 123 are made of either tungsten or molybdenum, which have comparatively high shear moduli. In certain embodiments, the first and fourth electrode layers 120, 123 of a representative embodiment is tungsten, which has a higher shear modulus than molybdenum, and therefore suppresses undesired lateral modes. Notably, in certain known BAW resonators the electrodes are made of solely of molybdenum rather than solely of tungsten because of the relative electrical conductivities of these materials for the benefit of electrical performance (insertion loss) in devices comprising such known BAW resonators, as well as thermal dissipation. However, molybdenum has a lower shear modulus than tungsten. As such, the selection of molybdenum for the electrodes of certain known BAW resonators is realized at the cost of increased losses to spurious modes (and a lower Q) compared to known BAW resonators that use only tungsten for the electrodes. As such, in known BAW resonators, a trade-off of improved electrical performance at the expense of acoustic performance often is made by the selection of molybdenum as the material for the electrodes. However, and by contrast, because of the improved electrical conductivity of beryllium compared to molybdenum, the second and third electrode layers 121, 122 result in reduced resistive losses, and improved insertion loss.

In accordance with a representative embodiment, the thickness of beryllium each of the second and third electrode layers 121, 122 is in the range of approximately 3000 Å to approximately 5000 Å, enabling the setting of the frequency of the BAW resonator 500. In a representative embodiment, the first and fourth electrode layers 120, 123 are tungsten, and each of first and fourth electrode layers 120, 123 has a thickness in the range of approximately 1000 Å to approximately 6000 Å. Notably, in this representative embodiment, the an increase in the thickness of tungsten (W) in first and fourth electrode layers 120, 123 will vary inversely with the Be thickness, but more slowly.

Similarly, and as noted above, the first and second barrier layers 501, 502 are tungsten (W). As will be appreciated, in order to prevent deleterious impact on the electrical performance of the BAW resonator 500, the first and second barrier layers 501, 502 are comparatively thin. In accordance with a representative embodiment, the (W) the first and second barrier layers 501, 502 have a thickness in the range of approximately 300 Å to approximately 500 Å depending on the frequency of the BAW resonator 500, Specifically, the thickness of metal layers in electrodes will vary primarily with resonator frequency, but also with desired $kt^2$ effective to a lesser extent.

Finally, the piezoelectric layer 103 has a thickness in the range approximately 0.25 µm to approximately 1.4 µm. Moreover, and as described more fully herein, the thicknesses of the first-fourth electrode layers 120-123 and the piezoelectric layer 103, and the doping of the piezoelectric layer 103 (e.g., AScN) can be tailored to accommodate for various parameters for design optimization of BAW resonator 100.

As noted above, the acoustic stack 140 of BAW resonator 100 has a thickness (z-direction of the coordinate system of FIG. 5) of approximately is approximately $\lambda/2$, where $\lambda$ is a wavelength corresponding to a desired thickness extensional resonance frequency of the BAW resonator 100. In known BAW resonators having a single electrode material (e.g., W or Mo), the thickness of the acoustic stack 140 is made up approximately 25% for each electrode, and 50% for the piezoelectric layer. By the present teachings, the second and third electrode layers 121, 122 replace 20%-40% of the thickness of the single-material electrode with an equivalent mass of beryllium. Just by way of example, in a representative embodiment, a thickness of 500 Å of tungsten can be replaced by an equivalent mass (approximately 3000 Å) of beryllium. In accordance with a representative embodiment, the portion of the overall thickness of the first and second electrodes 102, 104 made up by the second and third electrode layers 121,122 that is beryllium is governed by certain competing parameters, and is selected based on certain desired results. For example, increasing the portion of the over thickness of the first and second electrodes 102, 104 made up by the second and third electrode layers 121,122, which are beryllium, will improve the thermal conductivity (and thus heat dissipation) and electrical resistance (and thus insertion loss). However, because of the comparatively low acoustic impedance of beryllium, the electromechanical coupling coefficient ($kt^2$) is also comparatively reduced. As is known, the electromechanical coupling coefficient $kt^2$ indicates the efficiency of energy transfer between electrodes and the piezoelectric materials. This coefficient influences insertion loss and bandwidth of the BAW resonator 100 and devices (e.g., filters) incorporating the BAW resonator 100. Accordingly, the desired improvement in acoustic losses (and corresponding improvement in Q), and the improvement in thermal and electrical properties realized by the use of beryllium must be weighed against the reduction in the electromechanical coupling coefficient $kt^2$ (and thus Q).

As noted above, the acoustic stack 140 of BAW resonator 100 has a thickness (z-direction of the coordinate system of FIG. 5) of approximately is approximately $\lambda/2$, where $\lambda$ is a wavelength corresponding to a desired thickness extensional resonance frequency of the BAW resonator 100. In known BAW resonators having a single electrode material (e.g., W or Mo), the thickness of the acoustic stack 140 is made up approximately 25% for each electrode, and 50% for the piezoelectric layer. By the present teachings, generally, the second and third electrode layers 121, 122 replace 20%-40% of the thickness of the single-material electrode with an equivalent mass of beryllium. Just by way of example, in a representative embodiment, a thickness of 500 Å of tungsten can be replaced by an equivalent mass (approximately 3000 Å) of beryllium. In accordance with a representative embodiment, the portion of the overall thickness of the first and second electrodes 102, 104 made up by the second and third electrode layers 121,122 that is beryllium is governed by certain competing parameters, and is selected based on certain desired results. For example, increasing the portion of the thickness of the first and second electrodes 102, 104 made up by the second and third electrode layers 121,122, which are beryllium, will improve the thermal conductivity (and thus heat dissipation) and electrical resistance (and thus insertion loss). However, because of the comparatively low acoustic impedance of beryllium, the electromechanical coupling coefficient ($kt^2$) is also comparatively reduced. As is known, the electromechanical coupling coefficient $kt^2$ indicates the efficiency of energy transfer between electrodes and the piezoelectric materials. This coefficient influences insertion loss and bandwidth of the BAW resonator 100 and devices (e.g., filters) incorporating the BAW resonator 100. Accordingly, the desired improvement in acoustic losses (and corresponding improvement in Q), and the improvement in thermal and electrical properties realized by the use of beryllium must be weighed against the reduction in the electromechanical coupling coefficient $kt^2$.

In specific representative embodiments, while keeping the frequency of the BAW resonator 100 constant, the "replacing" or "substituting" with beryllium (Be) of a portion of molybdenum (Mo) or tungsten (W) in a known electrode can be effected with considerations of the location of the comparatively low acoustic impedance material (e.g., Be) in the acoustic stack 140. As noted above, in certain representative embodiments, the second and third electrode layers 121, 122 comprise comparatively low acoustic impedance material (e.g., Be), and the first and fourth electrode layers 120, 123 comprise comparatively high acoustic impedance material (e.g., Mo or W). As noted above, in other representative embodiments, the second and third electrode layers 121, 122 comprise comparatively high acoustic impedance material, and the first and fourth electrode layers 120, 123 comprise comparatively low acoustic impedance material. Stated somewhat differently, in the former embodiment, the comparatively low acoustic impedance material electrode layers are disposed nearer to the middle (i.e., at a point of high stress, where very little motion occurs, and where the stiffness of the material that is an important consideration) of the acoustic stack 140 (i.e., sandwiching the piezoelectric layer 103), whereas in the latter embodiment, the low acoustic impedance material layers are disposed near the top and bottom of the acoustic stack 140 (i.e., at or near the interface of the acoustic stack 140 with air).

In the representative embodiment where the second and third electrode layers 121, 122 comprise comparatively low acoustic impedance material (e.g., Be), the portion of tungsten (W) or molybdenum (Mo) of a known resonator electrode that is "replaced" by beryllium (Be) (again for constant frequency) can be determined based on a ratio of the velocity of sound ratio of the two materials. Just by way of example, in such an embodiment, the ratio of the sound velocity ratio beryllium (Be) to molybdenum (Mo) is approximately 2.5:1. This equates to replacing 1 unit of thickness of molybdenum with approximately 2.5 units of thickness of Be. So, approximately 2.5 Å of beryllium (Be) "replaces" 1.0 Å of molybdenum (Mo). Similarly, the ratio of sound velocity ratio beryllium (Be) to tungsten (W), is approximately 2.3:1. So, approximately 2.3 Å beryllium (Be) "replaces" 1.0 Å of molybdenum (Mo) when the second and third electrode layers 121, 122 comprise the comparatively low acoustic impedance material (Be).

In the representative embodiment in which the first and fourth electrodes 120, 123 comprise the comparatively low acoustic impedance materials (i.e., at or near the interface with air, where the mass of the material governs), the ratio of densities gives the correct substitution ratio to keep frequency constant the portion of tungsten (W) or molybdenum (Mo) of a known resonator electrode that is "replaced" by beryllium (Be) can be determined based on a ratio of the density of the two materials (Be, and W or Mo). So, by way of example, and in such an embodiment, ratio of the density of molybdenum (Mo) to beryllium (Be) is approximately 5:1. This equates to replacing 1 unit of thickness of molybdenum with approximately 5 units of thickness of Be. So, approximately 5 Å of beryllium (Be) "replaces" 1.0 Å of molybdenum (Mo). Similarly, the ratio of densities of beryllium (Be) to tungsten (W), is approximately 10:1. So, approximately 10 Å beryllium (Be) "replaces" 1.0 Å of tungsten (W).

Finally, and as alluded to above, significant design considerations for acoustic resonators include, among other things, chip area. There are various factors that affect each of these considerations. The use of doped piezoelectric material (e.g., AScN) can improve the piezoelectric coupling coefficient of a BAW resonator, which in turn improves the bandwidth of a filter including the BAW resonator. Alternatively, scaling down the thickness of the piezoelectric layer 103 will reduce the effective coupling and resonator area while improving the Q of the resonator, which results in better insertion loss. For example, in accordance with a representative embodiment, the selection of a comparatively high atomic percentage of scandium doping in the AScN layer that comprises piezoelectric layer 103 can be made to compensate for a reduction in the electromechanical coupling coefficient $kt^2$ when a thicker layer of beryllium is used for the second and third electrode layers 121,122. Alternatively, providing second and third electrode layers 121, 122 of beryllium, first and fourth electrode layers 120, 123 of tungsten, and a comparatively high atomic percentage of scandium doping in the AScN layer that comprises piezoelectric layer 103 allows for a comparatively thin piezoelectric layer 103 and a reduced areal dimension of the BAW resonator 100 with acceptable electromechanical coupling coefficient $kt^2$, reduced acoustic losses, reduced resistive losses, and improved thermal dissipation.

When connected in a selected topology, a plurality of BAW resonators 100, 200, 300, 400, 500 can function as an electrical filter. FIG. 6 shows a simplified schematic block diagram of an electrical filter 600 in accordance with a representative embodiment. The electrical filter 600 comprises series BAW resonators 601 and shunt BAW resonators 602. The series BAW resonators 601 and shunt BAW resonators 602 may comprise the BAW resonators 100, 200, 300, 400, 500 described in connection with the representative embodiments of FIGS. 1A, 1B, 2, 3, 4, and 5. The electrical filter 600 is commonly referred to as a ladder filter, and may be used for example in duplexer applications. Further details of a ladder-filter arrangement may be as described for example in U.S. Pat. No. 5,910,756 to Ella, and U.S. Pat. No. 6,262,637 to Bradley, et al. The disclosures of these patents are specifically incorporated by reference. It is emphasized that the topology of the electrical filter 600 is merely illustrative and other topologies are contemplated. Moreover, the acoustic resonators of the representative embodiments are contemplated in a variety of applications besides duplexers.

In accordance with illustrative embodiments, acoustic resonators for various applications such as in electrical filters are described having electrodes with at least some beryllium therein. One of ordinary skill in the art appreciates that many variations that are in accordance with the present teachings are possible and remain within the scope of the appended claims. These and other variations would become clear to one of ordinary skill in the art after inspection of the specification, drawings and claims herein. The invention therefore is not to be restricted except within the spirit and scope of the appended claims.

The invention claimed is:

1. A bulk acoustic wave (BAW) resonator, comprising:
a substrate comprising an acoustic reflector;
an acoustic stack, comprising:
 a first piezoelectric layer disposed over the substrate;
 a first electrode disposed over the first piezoelectric layer and the acoustic reflector, and comprising a first layer comprising a comparatively high acoustic impedance material, and a second layer comprising a comparatively low acoustic impedance material;
 a second piezoelectric layer disposed over the second layer;
 a first barrier layer disposed between the second layer and the second piezoelectric layer;
 a second electrode disposed over the second piezoelectric layer, and comprising a third layer comprising the comparatively low acoustic impedance material, and a fourth layer comprising the comparatively high acoustic impedance material and being disposed directly on the second piezoelectric layer; and
 a second barrier layer disposed between the second piezoelectric layer and the third layer;
 wherein the second layer and the third layer are each a Beryllium layer of a thickness in a range of 3,000 angstroms to 5,000 angstroms;
 wherein a total thickness of the acoustic stack is approximately $\lambda/2$, wherein $\lambda$ is a wavelength corresponding to a thickness extensional resonance frequency of the BAW resonator;
 wherein the first barrier layer is made of the same material as the first layer and the second barrier layer is made of the same material as the fourth layer.

2. The BAW resonator of claim 1, wherein the comparatively high acoustic impedance material comprises one of tungsten or molybdenum.

3. The BAW resonator of claim 1, wherein the second piezoelectric layer is disposed directly on the second layer.

4. The BAW resonator of claim 1, wherein the second piezoelectric layer comprises highly-textured aluminum nitride (AlN).

5. The BAW resonator of claim 4, wherein the highly-textured aluminum nitride (AlN) is doped with scandium.

6. The BAW resonator of claim 1, wherein the second piezoelectric layer is scandium-doped aluminum nitride (ASN) having a doping concentration in a range of approximately 3 atomic percent to approximately 40 atomic percent.

7. The BAW resonator of claim 6, wherein the second piezoelectric layer has a thickness in a range of approximately 2500 Å to approximately 1.4 μm.

8. The BAW resonator of claim 7, wherein the comparatively high acoustic impedance material is tungsten (W).

9. The BAW resonator of claim 7, wherein the comparatively high acoustic impedance material has a thickness in a range of approximately 1000 Å to approximately 6000 Å.

10. A bulk acoustic wave (BAW) resonator, comprising:
an acoustic stack, comprising:
 a substrate comprising an acoustic reflector;
 a first beryllium electrode disposed over the acoustic reflector, the first beryllium electrode being a thickness in a range of 3,000 angstroms to 5,000 angstroms;
 a piezoelectric layer disposed over the first beryllium electrode;
 a second beryllium electrode disposed over the piezoelectric layer, the second beryllium electrode being the thickness in the range of 3,000 angstroms to 5,000 angstroms;
 a first barrier layer disposed between the first beryllium electrode and the piezoelectric layer; and
 a second barrier layer disposed between the piezoelectric layer and the second beryllium electrode;
 wherein the first barrier layer is made of the same material as the first beryllium electrode, and the second barrier layer is made of the same material as the second beryllium electrode.

11. The BAW resonator of claim 10, wherein the piezoelectric layer is disposed directly on the first beryllium electrode, and the second beryllium electrode is disposed directly on the piezoelectric layer.

12. The BAW resonator of claim 10, wherein the piezoelectric layer is aluminum nitride (AlN).

13. The BAW resonator of claim 10, wherein thicknesses of the first beryllium electrode and the second beryllium electrode are in a range of 0.1 μm to approximately 2.0 μm.

14. The BAW resonator of claim 10, wherein the piezoelectric layer is scandium-doped aluminum nitride (ASN) having a doping concentration in a range of approximately 3 atomic percent to approximately 40 atomic percent.

15. The BAW resonator of claim 10, wherein the piezoelectric layer has a thickness in a range of approximately 2500 Å to approximately 1.4 μm.

16. A bulk acoustic wave (BAW) resonator, comprising:
a substrate comprising an acoustic reflector;
an acoustic stack, comprising:
 a first piezoelectric layer disposed over the substrate;
 a first electrode disposed over the first piezoelectric layer and the acoustic reflector, and comprising a first layer comprising a comparatively high acoustic impedance material, and a second layer comprising a comparatively low acoustic impedance material;
 a piezoelectric layer disposed over the second layer;
 a first barrier layer disposed between the second layer and the piezoelectric layer;
 a second electrode disposed over the piezoelectric layer, and comprising a third layer comprising the comparatively low acoustic impedance material, and a fourth layer comprising the comparatively high acoustic impedance material; and
 a second barrier layer disposed between the piezoelectric layer and the third layer;
 wherein the second layer and the third layer are each a Beryllium layer of a thickness in a range of 3,000 angstroms to 5,000 angstroms;
 wherein the first barrier layer is made of the same material as the first layer, and the second barrier layer is made of the same material as the fourth layer.

17. The BAW resonator of claim 16, wherein the comparatively high acoustic impedance material is either molybdenum (Mo) or tungsten (W).

* * * * *